(12) United States Patent
Zang et al.

(10) Patent No.: US 9,799,661 B1
(45) Date of Patent: *Oct. 24, 2017

(54) SRAM BITCELL STRUCTURES FACILITATING BIASING OF PULL-DOWN TRANSISTORS

(71) Applicant: GLOBALFOUNDRIES Inc., Grand Cayman (KY)

(72) Inventors: Hui Zang, Guilderland, NY (US); Manfred Eller, Beacon, NY (US); Min-hwa Chi, San Jose, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

This patent is subject to a terminal disclaimer.

(21) Appl. No.: 15/397,004

(22) Filed: Jan. 3, 2017

(51) Int. Cl.
| | |
|---|---|
| *H01L 27/108* | (2006.01) |
| *H01L 27/11* | (2006.01) |
| *H01L 29/49* | (2006.01) |
| *H01L 29/06* | (2006.01) |
| *H01L 21/84* | (2006.01) |
| *H01L 21/762* | (2006.01) |
| *G11C 11/419* | (2006.01) |

(52) U.S. Cl.
CPC ........ *H01L 27/1104* (2013.01); *G11C 11/419* (2013.01); *H01L 21/76283* (2013.01); *H01L 21/84* (2013.01); *H01L 29/0649* (2013.01); *H01L 29/4916* (2013.01)

(58) Field of Classification Search
CPC .. H01L 27/105; H01L 21/77; H01L 27/10844
See application file for complete search history.

(56) References Cited

U.S. PATENT DOCUMENTS

| | | | |
|---|---|---|---|
| 8,203,868 B2 | 6/2012 | Yamaoka et al. | |
| 2005/0219094 A1* | 10/2005 | Murphy | ............... H03K 17/785 341/133 |
| 2013/0058155 A1* | 3/2013 | Callen | ................ H01L 27/1104 365/154 |

OTHER PUBLICATIONS

L. Grenouillet, et al. "UTBB FDSOI transistors with dual STI for a multi-Vt strategy at 20nm node and below", IEEE, p. 3.6.1, 2012.

(Continued)

*Primary Examiner* — Mohammad Choudhry
(74) *Attorney, Agent, or Firm* — Heslin Rothenberg Farley & Mesiti P.C.; Kristian E. Ziegler

(57) ABSTRACT

Static random access memory (SRAM) bitcell structures with improved minimum operation voltage (Vmin) and yield are provided. The structures may include a silicon substrate, a deep n-well (DNW) layer, p-well (PW) regions, doped back-plate (BP) regions, a buried oxide (BOX) layer, and/or active regions formed on the BOX layer and over portions of the BP regions. At least one BP region may extend below at least one shallow trench isolation (STI) region, at least one contact to back plate (CBP), at least one active region and at least one PC construct overlapping the at least one active region forming a channel of at least one of a first pull-down (PD1) transistor and a second pull-down (PD2) transistor. The at least one CBP facilitates biasing at least one of the PD1 and PD2 transistors during at least one of a read, write or standby operation of the structures.

19 Claims, 22 Drawing Sheets

(56) References Cited

OTHER PUBLICATIONS

U.S. Appl. No. 15/397,021 to Hui Zang et al., filed Jan. 3, 2017, titled SRAM Bitcell Structures Facilitating Biasing of Pass Gate Transistors.
U.S. Appl. No. 15/395,036 to Hui Zang et al., filed Dec. 30, 2016, titled SRAM Bitcell Structures Facilitating Biasing of Pull-Up Transistors.

* cited by examiner

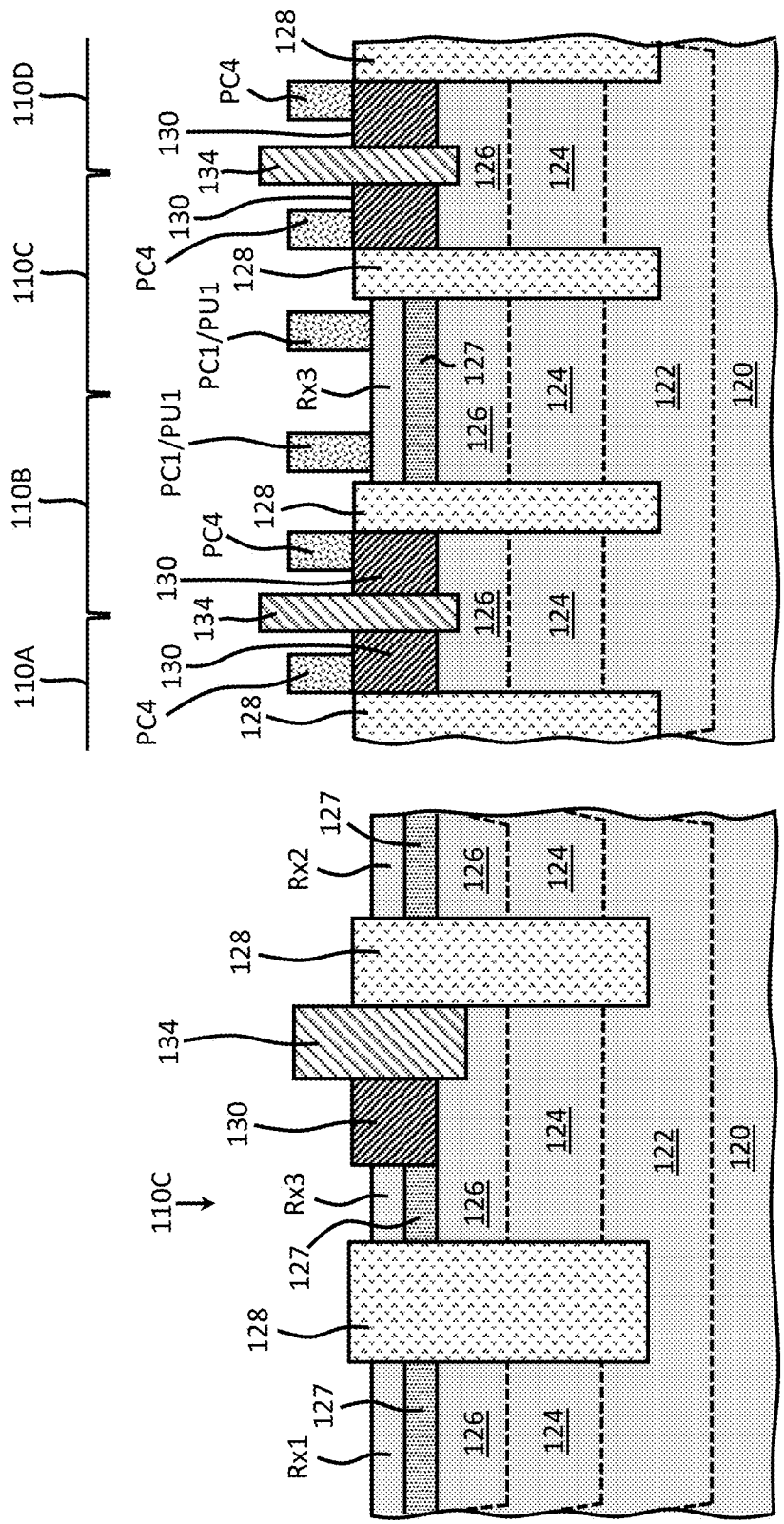

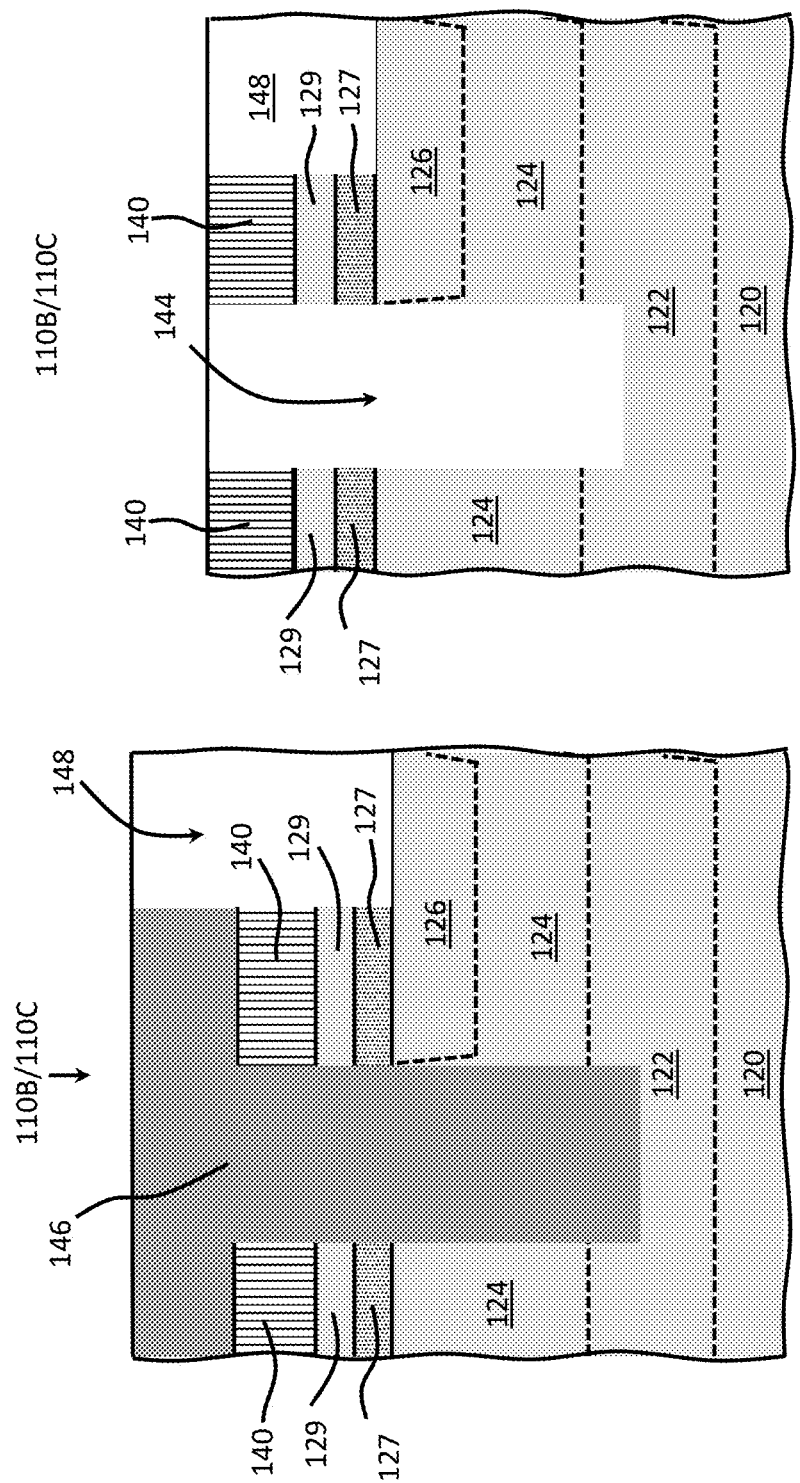

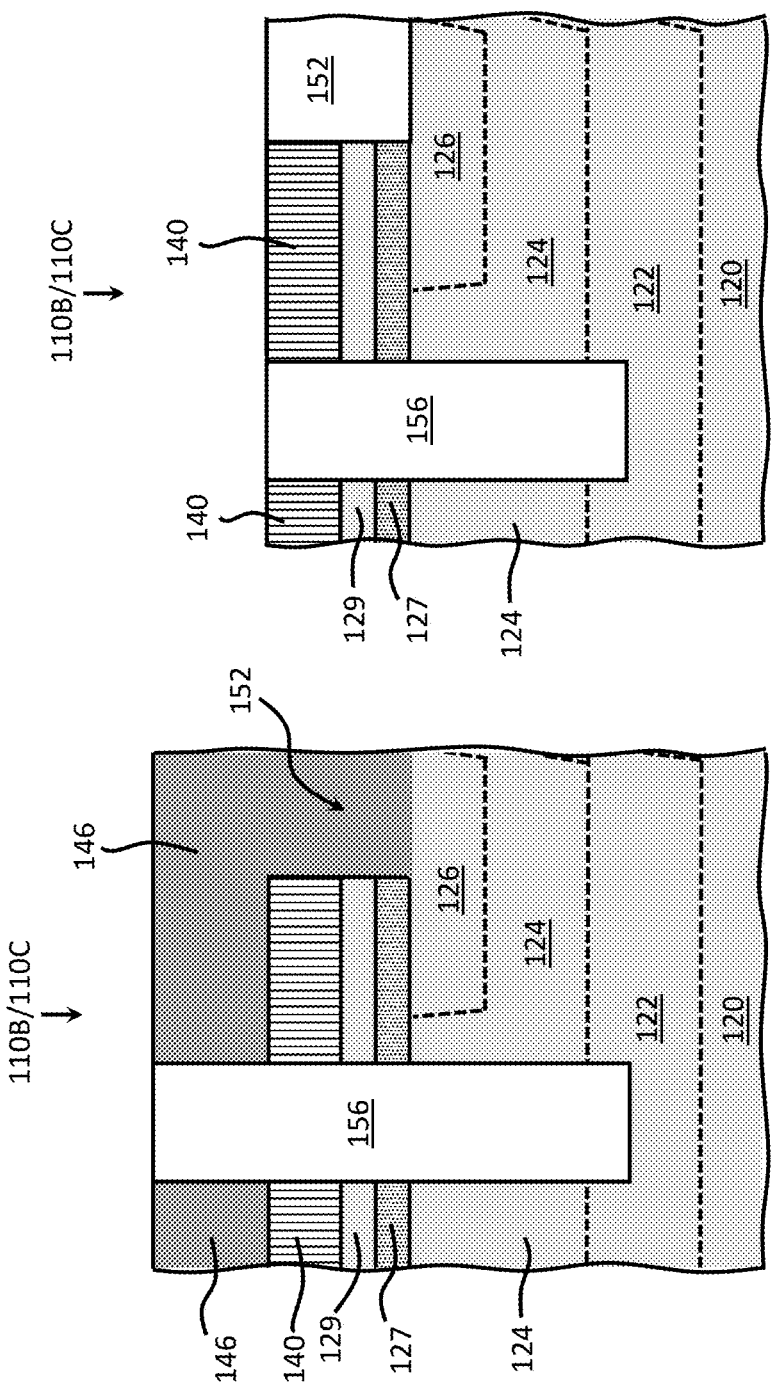

SRAM BITCELL STRUCTURES FACILITATING BIASING OF PULL-DOWN TRANSISTORS

FIELD OF THE INVENTION

The present disclosure generally relates to static random access memory (SRAM) bitcells, and more particularly, to SRAM bitcells fabricated on a silicon-on-insulator (SOI) substrate having improved minimum operation voltage (Vmin) and yield via dynamic biasing of at least one pull-down transistor thereof.

BACKGROUND OF THE INVENTION

Static random access memory (SRAM) cells or bitcells are commonly used in integrated circuits as a type of semiconductor memory that uses bistable latching circuitry to store each bit. SRAM can be fabricated on a silicon-on-insulator (SOI) substrate or a bulk silicon substrate with substantially the same operation principles. The term static differentiates it from dynamic RAM which must be periodically refreshed. SRAM bitcells have the advantageous feature of holding data without requiring a refresh. Some SRAM bitcells are single port, while some other SRAM bitcells are dual port. One typical SRAM bitcell is made up of six MOSFETs. Each bit in such a six transistor (6T) SRAM bitcell is stored on four transistors (two pull-up transistors and two pull-down transistors) that form two cross-coupled inverters. This storage cell has two stable states which are used to denote 0 and 1. Two additional access or pass-gate transistors serve to control the access to the 6T SRAM bitcell during read and write operations. The pass-gate transistors are thus utilized to read from or write into such a bitcell.

As lower power consumption is becoming a performance benchmark for microprocessors and system on chips (SoCs), 6T SRAM bitcells are designed to operate at a wide range of power supplies, including the minimum operating voltage (Vmin). Vmin generally refers to the lowest operating power supply level at which the bitcell can operate successfully for a given performance specification. The higher end of the wide range of power supplies allow the embedded memory arrays to operate faster at the cost of higher power dissipation, while the lower end of the wide range of power supplies allow the embedded memory arrays to operate at lower power dissipation, for example.

Yield is the fraction of working cells of all produced cells. The goal of every SRAM production is to reach a yield of close to 1. A bitcell will fail either due to read or write failure. If the SRAM bitcell it is not able to hold data, then the bitcell is considered a zero.

SRAM bitcells (or an array of SRAM bitcells), such as 6T SRAM bitcells, with improved Vmin and yield are therefore desirable.

SUMMARY OF THE INVENTION

In one aspect, the present disclosure provides for static random access memory (SRAM) bitcell structures including a semiconductor substrate including a silicon substrate, a deep n-well (DNW) layer formed over the silicon substrate, p-well (PW) regions formed over portions of the DNW layer, and doped back-plate (BP) regions formed over portions of the PW regions. The structures further include a buried oxide (BOX) layer formed over the PW regions and the BP regions of the semiconductor substrate, and first, second, third and fourth active regions formed on the BOX layer and over portions of the BP regions. The structures further include a first polysilicon gate conductor (PC) construct overlapping a portion of the first active region transistor and a portion of the third active region forming channels of a first pull-down (PD1) transistor and a first pull-up (PU1) transistor respectively, a second PC construct overlapping a portion of the second active region forming a channel of a second pass gate (PG2) transistor, a third PC construct overlapping a portion of the first active region forming a channel of a first pass gate (PG1) transistor, and a fourth PC construct overlapping a portion of the third active region and the fourth active region forming channels of a second pull-down (PD2) transistor and a second pull-up (PU2) transistor respectively. The structures further include at least one shallow trench isolation (STI) region extending at least one of from the first active region and below the first PC construct or from the second active region and below the fourth PC construct. The structures further include at least one contact to back gate (CBP). A BP region extends directly beneath the at least one CBP, the at least one STI region and the BOX layer below the channel of at least one of the PD1 transistor and the PD2 transistor to facilitate biasing of at least one the PD1 transistor and the PD2 transistor, respectively, via the at least one CBP during at least one of a read, write or standby operation of the bitcell structures.

In some embodiments, the structures may include a first STI region extending from the first active region and below the first PC construct, and a second STI region extending from the second active region and below the fourth PC construct. In some such embodiments, the structures may include a first CBP and a first BP region that extends directly beneath the first CBP, the first STI region and the BOX layer below the channel of the PD1 transistor, and a second CBP and a second BP region that extends directly beneath the second CBP, the second STI region and the BOX layer below the channel of the PD2 transistor. In some such embodiments, the first STI region may extend about a first portion of the first CBP and a first deep trench isolation (DPI) region extends about a second portion of the first CBP, and the second STI region may extend about a first portion of the second CBP and a second DPI region extends about a second portion of the second CBP. In some embodiments, the first DPI region may extend into the bitcells structures past the first BP region, through at least one PW region, and at least partially through the DNW layer, and the second DPI region may extend into the bitcells structures past the second BP region, through at least one PW region, and at least partially through the DNW layer.

In some other such embodiments, the first STI region may extend below the first and third PC constructs and therebetween, and the second STI region may extend below the fourth and second PC constructs and therebetween. In some such embodiments, the first BP region may further extend directly beneath the BOX layer below the channel of the PG1 transistor to facilitate biasing of the PD1 transistor and the PG1 transistor via the first CBP during at least one of a read, write or standby operation of the bitcell structures, and the second BP region may further extend directly beneath the BOX layer below the channel of the PG2 transistor to facilitate biasing of the PD2 transistor and the PG2 transistor via the second CBP during at least one of a read, write or standby operation of the bitcell structures. In some other such embodiments, the first STI region may extend about a first portion of the first CBP and a first deep trench isolation (DPI) region may extend about a second portion of the first CBP, and the second STI region may extend about a first portion of the second CBP and a second DPI region may extend about a second portion of the second CBP. In some such embodiments, the first DPI region may extend into the bitcells structures past the first BP region, through at least one PW region, and at least partially through the DNW layer, and the second DPI region may extend into the bitcells structures past the second BP region, through at least one PW region, and at least partially through the DNW layer.

In some embodiments, the structures may further include a third STI region extending from an opposing side of the first active region as the first STI region to the third active region, and a fourth STI region extending from an opposing side of the second active region as the second STI region and to the fourth active region. In some such embodiments, the third STI region may extend below the first PC construct, and the fourth STI region may extend below the fourth PC construct. In some such embodiments, the first BP region may further extend directly beneath the third STI region and the BOX layer below the channel of the PU1 transistor to facilitate biasing of the PD1 transistor, the PG2 transistor and the PU1 transistor via the first CBP during at least one of a read, write or standby operation of the bitcell structures, and the second BP region may further extend directly beneath the fourth STI region and the BOX layer below the channel of the PU2 transistor to facilitate biasing of the PD2 transistor, the PG1 transistor and the PU1 transistor via the second CBP during at least one of a read, write or standby operation of the bitcell structures. In some such embodiments, the first STI region may extend about a first portion of the first CBP and a first deep trench isolation (DPI) region may extend about a second portion of the first CBP, and the second STI region may extend about a first portion of the second CBP and a second DPI region may extend about a second portion of the second CBP. In some such embodiments, the first DPI region may extend into the bitcells structures past the first BP region, through at least one PW region, and at least partially through the DNW layer, and the second DPI region may extend into the bitcells structures past the second BP region, through at least one PW region, and at least partially through the DNW layer.

In another aspect, the present disclosure provides for a method of selectively biasing at least one of a PD1 transistor and a PD2 transistor of a SRAM bitcell structure. The method includes at least one of selectively applying a grounding voltage or a lower voltage to the at least one CBP of at least one of the SRAM bitcell structures of the first aspect of the present disclosure during a read operation of the at least one bitcell structure, and selectively applying a positive voltage to the at least one CBP of at least one of the SRAM bitcell structures of the first aspect of the present disclosure during a write operation of the at least one bitcell structure.

In another aspect, the present disclosure provides a method of forming static random access memory (SRAM) bitcell structures including obtaining a semiconductor substrate including a silicon substrate, a deep n-well (DNW) layer formed over the silicon substrate, p-well (PW) regions formed over portions of the DNW layer, doped back-plate (BP) regions formed over portions of the PW regions, a buried oxide (BOX) layer formed over the PW regions and the BP regions of the semiconductor substrate, and an active layer formed on the BOX layer and over portions of the BP regions. The method further includes forming at least one deep trench extending through at least a first portion of the active layer and at least to the DNW layer. The method further includes forming at least one shallow trench extending through at least a second portion of the active layer and at least to a BP region such that at least one active region extending between the at least one deep trench and the at least one shallow trench is formed from the active layer and at a BP region extends beneath the at least one shallow trench and the at least one active region. The method further includes forming at least one polysilicon gate conductor (PC) construct overlapping the at least one active region to form a channel of at least one of a first pull-down (PD1) transistor and a second pull-down (PUD) transistor.

In some embodiments, the method further includes filling the at least one deep trench with an oxide material to form at least one deep trench isolation region (DTI), filling a first portion of the at least one shallow trench with an oxide material to form at least one shallow isolation region (STI), and filling a second portion of the at least one shallow trench with a conductive material to form at least one contact to back plate (CBP) region to facilitate biasing at least one of the PD1 transistor and the PD2 transistor via the at least one CBP during at least one of a read, write or standby operation of the bitcell structures. In some embodiments, the at least one shallow trench may be formed prior to formation of the at least one deep trench. In some embodiments, the at least one deep trench may be formed prior to formation of the at least one shallow trench.

The present disclosure may address one or more of the problems and deficiencies of the art discussed above, especially for SRAM bitcells fabricated on a SOI substrate. However, it is contemplated that the present disclosure may prove useful in addressing other problems and deficiencies in a number of technical areas. Therefore, the claimed invention should not necessarily be construed as limited to addressing any of the particular problems or deficiencies discussed herein.

Certain embodiments of the presently-disclosed semiconductor devices and methods of forming semiconductor devices have several features, no single one of which is solely responsible for their desirable attributes. Without limiting the scope of these methods as defined by the claims that follow, their more prominent features will now be discussed briefly. After considering this discussion, and particularly after reading the section of this specification entitled "Detailed Description of the Invention," one will understand how the features of the various embodiments disclosed herein provide a number of advantages over the current state of the art. These advantages may include, without limitation, providing 6T SRAM bitcells fabricated on a SOI substrate with improved Vmin and/or yield.

These and other features and advantages of this disclosure will become apparent from the following detailed description of the various aspects of the present disclosure taken in conjunction with the appended claims and the accompanying drawings.

BRIEF DESCRIPTION OF THE DRAWINGS

FIG. 4 illustrates a cross-sectional view of a portion of the bitcell array of FIG. 3;

FIG. 5 illustrates a cross-sectional view of another portion of the bitcell array of FIG. 3;

FIG. 8 illustrates an exemplary method of fabricating the bitcell array of FIG. 3 according to the present disclosure;

FIG. 9 illustrates an exemplary method of fabricating the bitcell array of FIG. 3 according to the present disclosure;

FIG. 14 illustrates another exemplary method of fabricating the bitcell array of FIG. 3 according to the present disclosure;

FIG. 15 illustrates another exemplary method of fabricating the bitcell array of FIG. 3 according to the present disclosure;

DETAILED DESCRIPTION OF THE INVENTION

Although this present disclosure is susceptible to embodiment in many different forms, certain embodiments of the present disclosure are shown and described. It should be understood, however, that the present disclosure is to be considered as an exemplification of the principles of this present disclosure and is not intended to limit the present disclosure to the embodiments illustrated.

Figure 1:
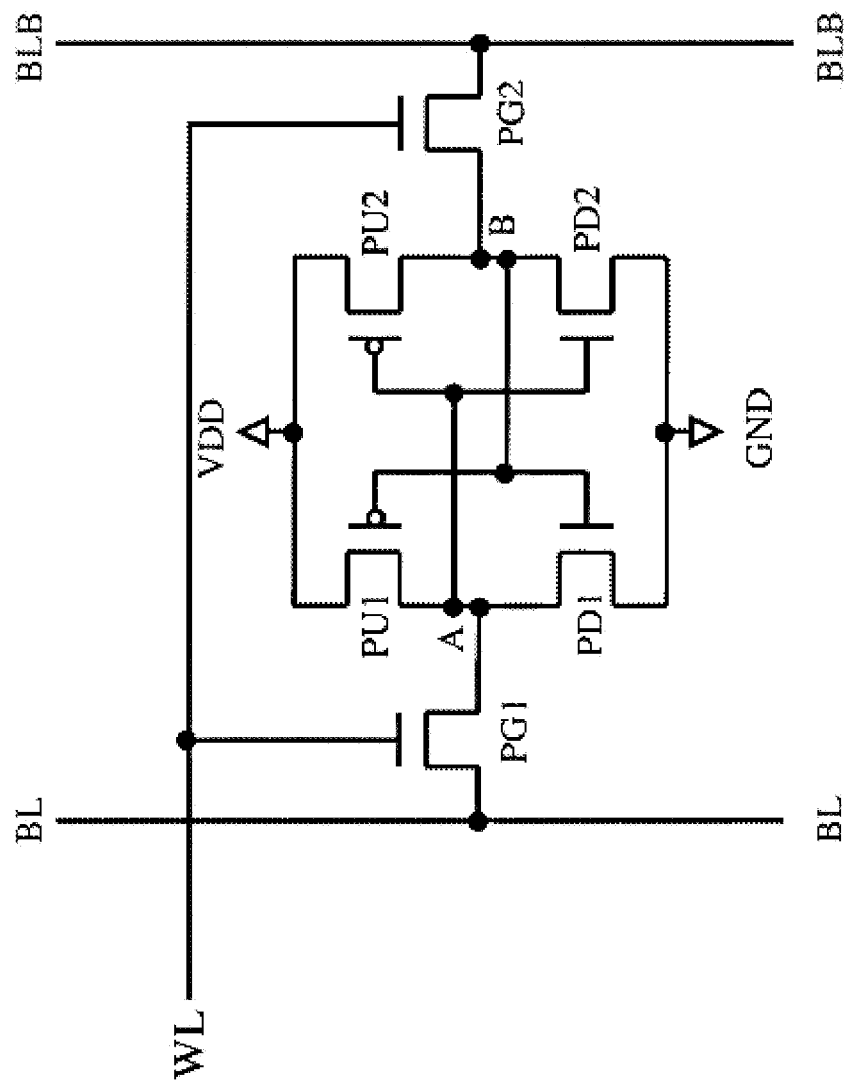
FIG. 1 illustrates a circuit diagram of an exemplary conventional six transistor (6T) static random access memory (SRAM) bitcell.

FIG. 1 illustrates a circuit diagram of an exemplary conventional 6T SRAM bitcell or memory cell. As noted above, a 6T SRAM bitcell must be able to hold, read and write data ideally very fast, on a minimum area, and with low leakage and high yield. As shown in FIG. 1, the conventional 6T SRAM cell is composed of two cross-coupled CMOS inverters implementing the positive feedback and therefore the two memory nodes A, B which keep the information (e.g., 0 or 1). The transistors forming the cross-coupled inverters may be first and second pullup transistors PU1, PU2 and first and second pulldown transistors PD1, PD2, as shown in FIG. 1.

The SRAM bitcell also includes two additional pass gate or access transistors PG1, PG2 electrically coupled or connected to complementary first and second column bitlines BL, BLB configured to read and write the bitcell in a differential way, as shown in FIG. 1. The pullups PU1, PU2 are typically p-type, while the pulldowns PD1, PD2 and pass-gates PG1, PG2 are typically n-type. The pass gate transistors PG1, PG2 may be p-type transistors, however, with the WL voltage polarity reversed in operation. In this disclosure, n-type pass gate transistors PG1, PG2 are discussed and utilized in the exemplary embodiments, but one of ordinary skill in the art would appreciate that p-type pass gate transistors PG1, PG2 may be utilized.

As also shown in FIG. 1, the pass gates are electrically coupled or connected to the word-line WL to perform the access write and read operations through or via the bitlines BL and BLB. The bitlines BL and BLB thereby act as input/output nodes carrying the data from the 6T SRAM bitcells to a sense amplifier during read operation, or from write circuitry to the 6T SRAM bitcell during write operations. The three modes of 6T SRAM bitcells are thereby a standby mode when the circuit is idle, a read mode when data is to be read-out (e.g., a 0 or 1 is requested), and a write mode when the content of the circuit is updated (e.g., a 0 or 1 is written).

In the standby mode of a conventional 6T SRAM bitcell as shown in FIG. 1, the pass gate or access transistors are disabled (WL=0), and the information is stored on the feedback-coupled inverter-pair. Since the word line WL is not asserted (WL=0), pass gate transistors PG1 and PG2, which connect the 6T SRAM bitcell from the first and second bitlines BL, BLB, are turned off and the 6T SRAM bitcell cannot be accessed. The two cross coupled inverters formed by the pulldown transistors PD1, PD2 will continue to feedback each other as long as they are connected to the supply, and data will hold in the latch.

In the read mode of a conventional 6T SRAM bitcell as shown in FIG. 1, the word line WL is asserted (WL=1) and both bitlines BL and BLB are pre-charged to an equal level (e.g. VDD, or half VDD), which enables both the pass gate transistors PG1 and PG2 (WL=1). The values stored in the nodes A, B thereby transferred to their respective bitlines BL and BLB. For example, the '0' memory node A or B provides a conducting pulldown through the respective pulldown transistor PD1 or PD2 to ground GND and discharges the respective bitline BL or BLB via the enabled or turned-on pass gate transistor PG1 or PG2. A sense amplifier detects the sloping voltage on one of both bitlines BL, BLB and concludes this side to be the '0' memory node. The sense-amplifier serves to speed-up the read process, because the bitline BL or BLB then does not need to be discharged completely down to 0 V. As an example, assuming "1" is stored at node A, BLB will discharge through the pull down transistor PD1 and the bit line BL will be pulled up through the pull up transistor PU1 toward VDD, and a logic 1 is achieved.

In the write mode of a conventional 6T SRAM bitcell as shown in FIG. 1, the mode is started from the "read" case and is successful if the an internal node A or B is flipped according to write data. For example if the bitcell is storing a "1" and a "0" is wished to be written, the bitline BL or BLB on the desired '0' memory node A or B is tied to ground GND or lowered to 0V, while the other bitline BL or BLB is kept or raised to VDD. The bitcell can then be selected by raising the word line WL to VDD, and if the cell is not in this state already, the voltage on the desired '0' node A or B will drop below the switching level of the opposite inverter and flip the bitcell. The terms write Vmin (WVmin) and writeability are used to describe the lowest operating power supply level or bitline BL or BLB voltage at which the 6T SRAM bitcell is able to successfully complete a write operation within a predefined time period.

The inventors have noted that writeability has a strong correlation to the bitcell gamma ratio (e.g., Ion_PG/Ion_PU) of the bitcell. The inventors have recognized that, therefore, the larger the bitcell gamma ratio (the larger the ratio of the strength or drive current of the pass gate transistors PG1 or PG2 to that of the pull up transistors PU1 or PU2), the greater the likelihood that a write failure of a 6T SRAM bitcell does not occur. Stated differently, the larger strength or drive current of the pass gate transistor PG1 or PG2 and the smaller the strength or drive current of the pull up transistor PU1 or PU2, the lesser the likelihood of a write failure to occur.

The inventors have also recognized that data retention of a 6T SRAM bitcell, both in standby mode and during a read mode, becomes less stable with lower supply voltage VDD, increasing leakage currents and increasing variability. A metric expressing how easily a bitcell flips under read conditions is commonly referred to as the disturb margin (DM) of the bitcell. One common DM or readability metric of a bitcell is the static noise margin (SNM), which is the maximum value of DC noise voltage (Vn) that can be tolerated by the SRAM bitcell without changing the stored bit. The equivalent circuit for the SNM definition includes the two DC noise voltage sources Vn placed in series with the cross-coupled inverters (pull-up transistors PU1 and PU2 and pull-down transistors PD1 and PD2) and with worst-case polarity at the internal nodes A and B. Locating the smallest square between the two largest ones delimited by the eyes of a plotted butterfly curve determines graphically the SNM. The bitcell is most vulnerable to noise during a read access since the "0" internal storage node Vr rises to a voltage higher than ground GND. Due to this voltage division on Vr, the SNM is primarily determined by the ratio of the strength of the pull down transistor PD1 or PD2 to the respective strength of the pass gate transistor PG1 or PG2, known as the beta cell ratio. The inventors have recognized that, therefore, the larger the bitcell beta ratio (e.g., Ion_PD/Ion_PG), the greater the likelihood that a read disturbance does not occur. The inventors have thereby recognized that, therefore, the lower the strength or drive current of the pass gate transistor PG1 or PG2 and the larger the strength or drive current of the respective pull up transistor PU1 or PU2 the lesser the likelihood of a read failure (i.e., the better the DM or SNM for a "read").

Figure 2:
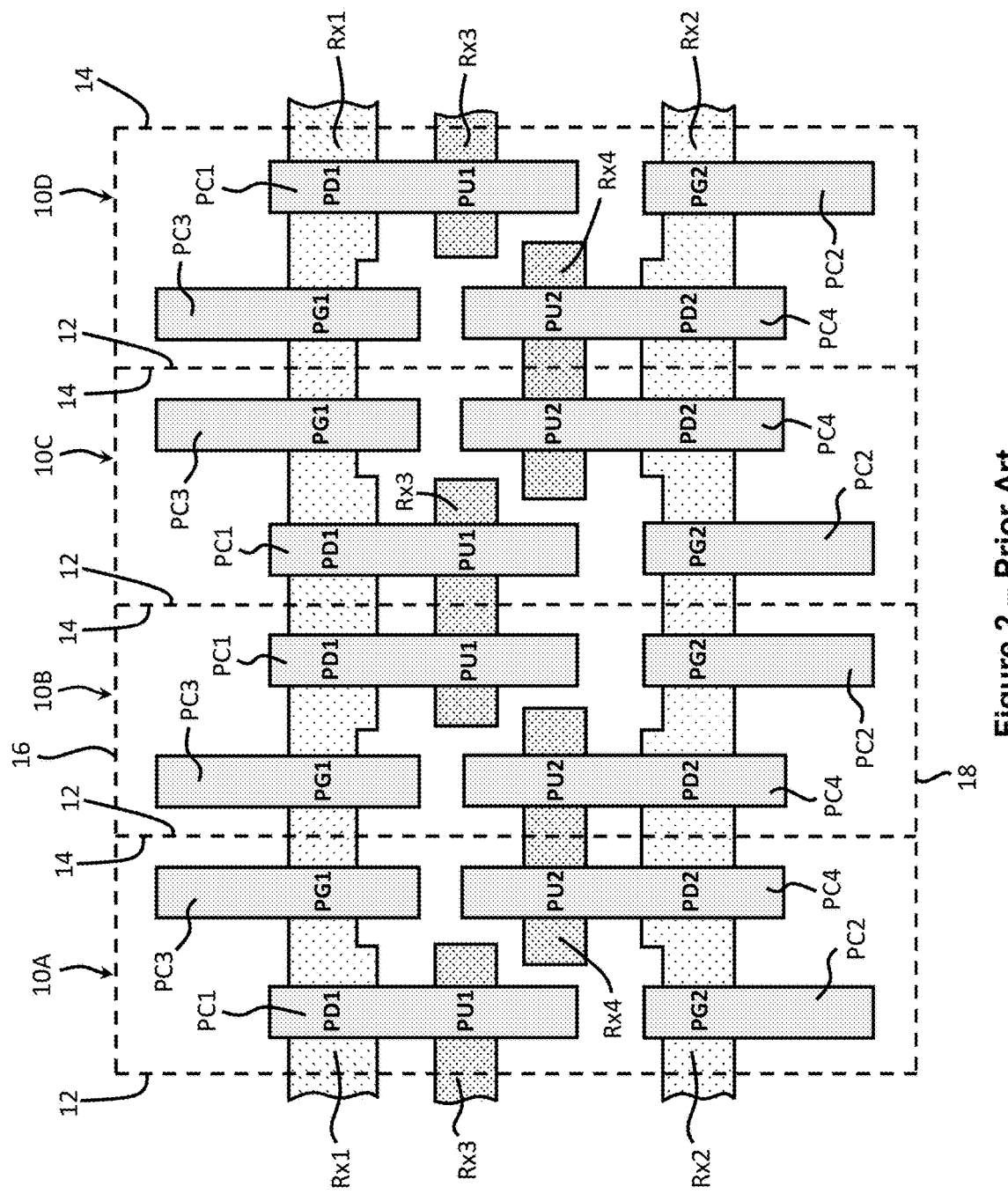
FIG. 2 illustrates a top view of an exemplary array of the exemplary 6T SRAM bitcell shown in FIG. 1.

FIG. 2 shows the physical layout of an array of four consecutive 6T SRAM bitcells 10A, 10B, 10C and 10D formed on a semiconductor substrate (e.g., a bulk or silicon-on-insulator (SOI) substrate and not shown here) and configured as shown in FIG. 1. As one of ordinary in the skill in the art would appreciate, the bitcells 10A, 10B, 10C and 10D may be part of a larger array of bitcells. Also in FIG. 2, only the layout of the active areas Rx1, Rx2, Rx3, Rx4 (elongated along the width direction (also referred to as the lateral or in horizontal direction) and polysilicon gate conductor (PC) constructs or gate stacks PC1, PC2, PC3, PC4 (elongated along the length direction (also referred to as the vertical direction) are illustrated while other features of the bitcells 10A, 10B, 10C and 10D, such as wells, contacts, metal interconnections, etc., are not shown for simplicity and clarity of the active areas Rx1, Rx2, Rx3, Rx4 and the PC constructs PC1, PC2, PC3, PC4.

As those skilled in the art would appreciate, the overlapped portions of a PC construct or gate stack PC1, PC2, PC3, PC4 and an active region Rx1, Rx2, Rx3, Rx4 may form a channel of a respective transistor (e.g., a channel of the PU1, PU2, PD1, PD2, PG1 or PG2 transistors), and the other portions of the active areas active regions Rx1, Rx2, Rx3, Rx4 outside the PC constructs PC1, PC2, PC3, PC4 (i.e., portions not overlapped by a PC construct PC1, PC2, PC3, PC4) may form a source/drain of the respective transistor. As shown in FIG. 2, the first active region Rx1 and the second active region Rx2 may form n-channel transistors (e.g., PG1, PD1, PG2 and PD2 transistors), and the second third active region Rx3 and the fourth active region Rx4 may form p-channel transistors (e.g., PU1 and PU2 transistors). The active regions Rx1, Rx2, Rx3, Rx4 and the PC constructs PC1, PC2, PC3, PC4 of the SRAM bitcells may be fabricated or formed on or over a SOI substrate. For example, the PU1, PU2, PD1, PD2, PG1 and PG2 transistors may be formed at least partly in/by a Si layer that is formed over a buried-oxide (BOX) layer. In some embodiments, the BOX layer may be a layer of silicon dioxide. The BOX layer may be formed over p-well (PW) regions and doped back-plate (BP) regions of the semiconductor substrate. The first, second, third and fourth active regions Rx1, Rx2, Rx3, Rx4 may be formed on the BOX layer and over portions of the BP regions of the semiconductor substrate. The semiconductor substrate may include a silicon substrate, a deep n-well (DNW) layer formed over the silicon substrate, and the PW regions formed over portions of the DNW layer. The BP regions may be formed over and/or within portions of the PW regions. The BP regions may be embedded or extend within the PW regions such that the PW regions and the BP regions may combine to form a substantially planar upper surface onto which the BOX layer is formed. In this way, portions of the PW regions and the BP regions may extend directly beneath the BOX layer of the SOI substrate. The BP regions may extend directly beneath the BOX layer below the channel of at least one of the PG1, PG2, PD1, PD2, PU1 and PU2 transistors to facilitate biasing of the at least one the transistors (via the at least one contact to back-plate (CBP) and at least one shallow trench isolation (STI) as described below) during at least one of a read, write or standby operation of the bitcell structures. The threshold-voltage (Vt) of at least one of the pull-up, pull-down and/or pass gate transistors of the SRAM bitcells can thereby be tuned. This disclosure provides SRAM bitcell structures and related methods that selectively and dynamically tune, or facilitate selective and dynamic tuning of, the bias of one or more of the BP regions of one or more transistors of the bitcells by adding a CBP to the one or more BP regions through at least one STI region.

As shown in FIG. 2, the array includes a first elongate active region Rx1 adjacent a top side 16 of the bitcells 10A, 10B, 10C and 10D along a length thereof and extending across a width the bitcells 10A, 10B, 10C and 10D from a first side 12 to a second side 14 thereof. The first active region Rx1 includes wider portions and narrow portions (with respect to the length direction) spanning across every other junction (e.g., odd junctions) of the second side of one of the bitcells 10A, 10B, 10C and 10D and the first side of an adjacent and adjoining bitcell 10B, 10C or 10D and across a portion of each bitcell 10A, 10B, 10C and 10D along the width direction. For example, the first active region Rx1 includes narrow portions extending across the junction of the second side of bitcell 10A and the first side of bitcell 10B, and the second side of bitcell 10C and the first side of bitcell 10D, along the width direction. The narrow portions of the first active region Rx1 may extend partially across the width of the bitcells 10A, 10B, 10C and 10D such that each bitcell 10A, 10B, 10C and 10D includes both a wide portion and a narrow portion of the first active region Rx1 extending there-across along the width direction.

As shown in FIG. 2, the bitcells 10A, 10B, 10C and 10D further include a second elongate active region Rx2 adjacent a bottom side of the bitcells 10A, 10B, 10C and 10D along a length thereof and extending across a width the bitcells 10A, 10B, 10C and 10D from a first side 12 to a second side 14 thereof. The second active region Rx2 is substantially a mirror image of the first active region Rx1, and thereby includes the wide and narrow portions in the length direction that extend across a portion of each bitcell 10A, 10B, 10C and 10D and across every other junction of the first and second sides 12, 14 of the bitcells 10A, 10B, 10C and 10D. However, the second active region Rx2 may be shifted along the width of the direction of the bitcells 10A, 10B, 10C and 10D with respect to the first active region Rx1 such that the narrow portions span across the junctions of the first and second sides 12, 14 of bitcells 10A, 10B, 10C and 10D that the wide portions first active region Rx1 span, and the wide portions span across the junctions of the first and second sides 12, 14 of bitcells 10A, 10B, 10C and 10D that the narrow portions first active region Rx1 span. In this way, if the narrow portions of the first active region Rx1 span across odd junctions of the first and second sides 12, 14 of the bitcells 10A, 10B, 10C and 10D along the width direction, the narrow portions of the second active region Rx2 span across even junctions of the first and second sides 12, 14 of the bitcells 10A, 10B, 10C and 10D along the width direction.

As shown in FIG. 2, the array further includes a plurality of third elongate active regions Rx3 spaced and aligned along the width direction, and positioned between the first and second active regions Rx1, Rx2 along the length direction that is proximate to the first active region Rx1. The third active regions Rx3 may be substantially rectangular. The third active regions Rx3 span across every other junction (e.g., even junctions) of the second side of one of the bitcells 10A, 10B, 10C and 10D and the first side of an adjacent and adjoining bitcell 10B, 10C or 10D, and across a portion of the respective bitcells 10A, 10B, 10C and 10D forming the junctions, along the width direction. As shown in FIG. 2, the third active regions Rx3 span across the junctions that the wide portions of the first active region Rx1 and the narrow portions of the second active region Rx2 extend across (and across a portion of the respective bitcells 10A, 10B, 10C and 10D forming the junctions).

The bitcells 10A, 10B, 10C and 10D may further include a plurality of fourth elongate active regions Rx4 spaced and aligned along the width direction, and positioned between the first and second active regions Rx1, Rx2 along the length direction that is proximate to the second active region Rx2. The fourth active regions Rx4 may be spaced from the third active regions Rx3 along the length direction. In some embodiments, the fourth active regions Rx4 may be longer along the width direction than the third active regions Rx3. In some embodiments, the fourth active regions Rx4 may overlap with the third active regions Rx3 along the width direction (but spaced along the length direction), as shown in FIG. 2. The fourth active regions Rx4 may be substantially rectangular.

The fourth active regions Rx4 span across every other junction (e.g., odd junctions) of the second side 14 the bitcells 10A, 10B, 10C and 10D and the first side of an adjacent and adjoining bitcell 10B, 10C or 10D, and across a portion of the respective bitcells 10A, 10B, 10C and 10D forming the junctions, along the width direction. As shown in FIG. 2, the fourth active regions Rx4 span across the junctions that the narrow portions of the first active region Rx1 and the wide portions of the second active region Rx2 extend across (and across a portion of the respective bitcells 10A, 10B, 10C and 10D forming the junctions). In this way, the fourth active regions Rx4 may span across the junctions of the bitcells 10A, 10B, 10C and 10D (and across the portions of the bitcells 10A, 10B, 10C and 10D themselves) along the width direction that the third active regions Rx3 do not.

In some embodiments, the first, second, third and/or fourth active regions Rx1, Rx2, Rx3 and Rx4 may be formed of a doped Si layer formed over the BOX layer. In some such embodiments, the source/drain regions of the first, second, third and/or fourth active regions Rx1, Rx2, Rx3 and Rx4 may thereby be a doped Si layer formed over the BOX layer. In some embodiments, first and/or second active regions Rx1, Rx2 may be n-type doped for forming n-type transistors, and the third and/or fourth active regions Rx3, Rx4 may be p-type doped for p-type transistors. In some embodiments, the first, second, third and/or fourth active regions Rx1, Rx2, Rx3 and Rx4 may be formed of silicon, silicon-germanium and/or gallium arsenide, and may or may not be doped. In some embodiments, the first, second, third and fourth active regions Rx1, Rx2, Rx3, Rx4 may be substantially coplanar. The first, second, third and/or fourth active regions Rx1, Rx2, Rx3, Rx4 may be isolated from each other by deep trench isolation (DTI) regions.

As noted above, a typical SOI-type substrate includes a layer of silicon atop a buried oxide (BOX) layer, which is atop an underlying semiconductor substrate. The semiconductor substrate may include the BP regions extending under the BOX layer and below or underneath portions of the first, second, third and/or fourth active regions Rx1, Rx2, Rx3, Rx4. The BP regions may be formed by doped layers or regions (e.g., N+ doped regions) with a p-well PW layer (not shown), and the PW layer may be formed over a deep n-well DNW layer (not shown). The first, second, third and/or fourth active regions Rx1, Rx2, Rx3, Rx4 may thereby be isolated from each other by DTIs extending between the first, second, third and/or fourth active regions Rx1, Rx2, Rx3, Rx4 and through or between the BP regions, through the PW layer, and at least partially through the DNW layer.

As shown in FIG. 2, the array of bitcells 10A, 10B, 10C and 10D may include a plurality of polysilicon gate conductor (PC) constructs (often refer to as gate-stacks) formed on the semiconductor substrate and over the first, second, third and fourth active regions Rx1, Rx2, Rx3, Rx4 to form the channels of the first and second pass gate transistors PG1, PG2, the first and second pull-down transistors PD1, PD2, and the first and second pull-up transistors PU1, PU2. In some embodiments, the PC constructs may be formed of a poly-Si, such as when a poly gate is utilized in a conventional-gate process flow. In some other embodiments, the PC constructs may be formed of a stack of multiple layers of materials (e.g., high-k dielectric layer(s), work-function layer(s), metal layer(s), etc.), such as such as when a replacement gate process flow is utilized (e.g., in advanced CMOS nodes). In some embodiments, the PC constructs may be formed of a metal and/or a poly-Si.

The PC constructs may be elongate along the length direction, as shown in FIG. 2. As also shown in FIG. 2, each of the bitcells 10A, 10B, 10C and 10D may include a first PC construct PC1 and a second PC construct PC2 that is proximate to one of the first or second sides along the width of the respective bitcell 10A, 10B, 10C and 10D, and a third PC construct PC3 and a fourth PC construct PC4 that is proximate to the other of the first or second sides of the respective bitcell 10A, 10B, 10C and 10D. The first and second PC constructs PC1, PC2 may be aligned along the width direction and spaced along the length direction. Similarly, the third and fourth PC constructs PC3, PC4 may be aligned along the width direction and spaced along the length direction.

The first PC construct PC1 may extend from past the first active region Rx1 that is proximate to the top side 16 of the bitcells 10A, 10B, 10C and 10D along length direction to past the third active region Rx3 that is proximate to the bottom side 18 of the bitcells 10A, 10B, 10C and 10D, as shown in FIG. 2. In this way, the first PC construct PC1 may extend over the first active region Rx1 and the third active region Rx3 along the length direction. The first PC construct PC1 may extend over the wide portion of the first active region Rx1. The first PC construct PC1 may extend past the third active region Rx3 along the length direction such that its end that is proximate to the bottom side 18 of the bitcells 10A, 10B, 10C and 10D is aligned with a portion of the fourth active region Rx4 along the length direction. The second PC construct PC2 may be aligned with the first PC construct PC1 along the width direction but spaced along the length direction. The second PC construct PC2 may extend from past the second active region Rx2 that is proximate to the top side 16 of the bitcells 10A, 10B, 10C and 10D along length direction to past the second active region Rx2 that is proximate to the bottom side 18 of the bitcells 10A, 10B, 10C and 10D. In this way, the second PC construct PC2 may extend over the narrow portion of the second active region Rx2. The end of the second PC construct PC2 that is proximate to the top side 16 of the bitcells 10A, 10B, 10C and 10D along the length direction may be aligned with the end of the wide portion of the second active region Rx2 that is that is proximate to the top side 16 of the bitcells 10A, 10B, 10C and 10D along the length direction.

The first pull-down transistor PD1 may be formed, at least in part, by the overlapping portion of the first active region Rx1 and the first PC construct PC1. Similarly, the first pull-up transistor PU1 may be formed, at least in part, by the overlapping portion of the third active region Rx3 and the first PC construct PC1. The second pass gate transistor PG2 may be formed, at least in part, by the overlapping portion of the second active region Rx2 and the second PC construct PC2.

As shown in FIG. 2, the third PC construct PC3 may extend from past the first active region Rx1 proximate to the top side 16 of the bitcells 10A, 10B, 10C and 10D along length direction to past the first active region Rx1 proximate to the bottom side 18 of the bitcells 10A, 10B, 10C and 10D. In this way, the first third PC construct PC3 may extend over the first active region Rx1. The third PC construct PC3 may extend over the narrow portion of the first active region Rx1. The third PC construct PC3 may extend past the first active region Rx1 along the length direction such that its end that is proximate to the bottom side 18 of the bitcells 10A, 10B, 10C and 10D is spaced from the third active region Rx3 along the along the length direction. The portion of the third PC construct PC3 extending past the first active region Rx1 proximate to the top side 16 may be greater than the portion of the third PC construct PC3 extending past the first active region Rx1 proximate to the bottom side 18.

As also shown in FIG. 2, the fourth PC construct PC4 may be aligned with the third PC construct PC3 along the width direction but spaced along the length direction. The fourth PC construct PC4 may extend from past the fourth active region Rx4 that is proximate to the top side 16 of the bitcells 10A, 10B, 10C and 10D along length direction to past the second active region Rx2 that is proximate to the bottom side 18 of the bitcells 10A, 10B, 10C and 10D, as shown in FIG. 2. In this way, the fourth PC construct PC4 may extend over the fourth active region Rx4 and the second active region Rx2 along the length direction. The fourth PC construct PC4 may extend over the wide portion of the second active region Rx2. The fourth PC construct PC4 may extend from between the first active region Rx1 and the third active region Rx3 along the length direction such that its end proximate to the top side 16 of the bitcells 10A, 10B, 10C and 10D is aligned with a portion of the third active region Rx3 along the along the length direction. The second PC construct PC2 may extend past the second active region Rx2 proximate to the bottom side 18 of the bitcells 10A, 10B, 10C and 10D along the length direction to a greater extent than the fourth PC construct PC4.

The first pass gate transistor PG1 may be formed, at least in part, by the overlapping portion of the first active region Rx1 and the third PC construct PC3, as shown in FIG. 2. The second pull-up transistor PU2 may be formed, at least in part, by the overlapping portion of the third active region Rx3 and the fourth PC construct PC4. Similarly, the second pull-down transistor PD2 may be formed, at least in part, by the overlapping portion of the second active region Rx2 and the fourth PC construct PC4.

Figure 3:
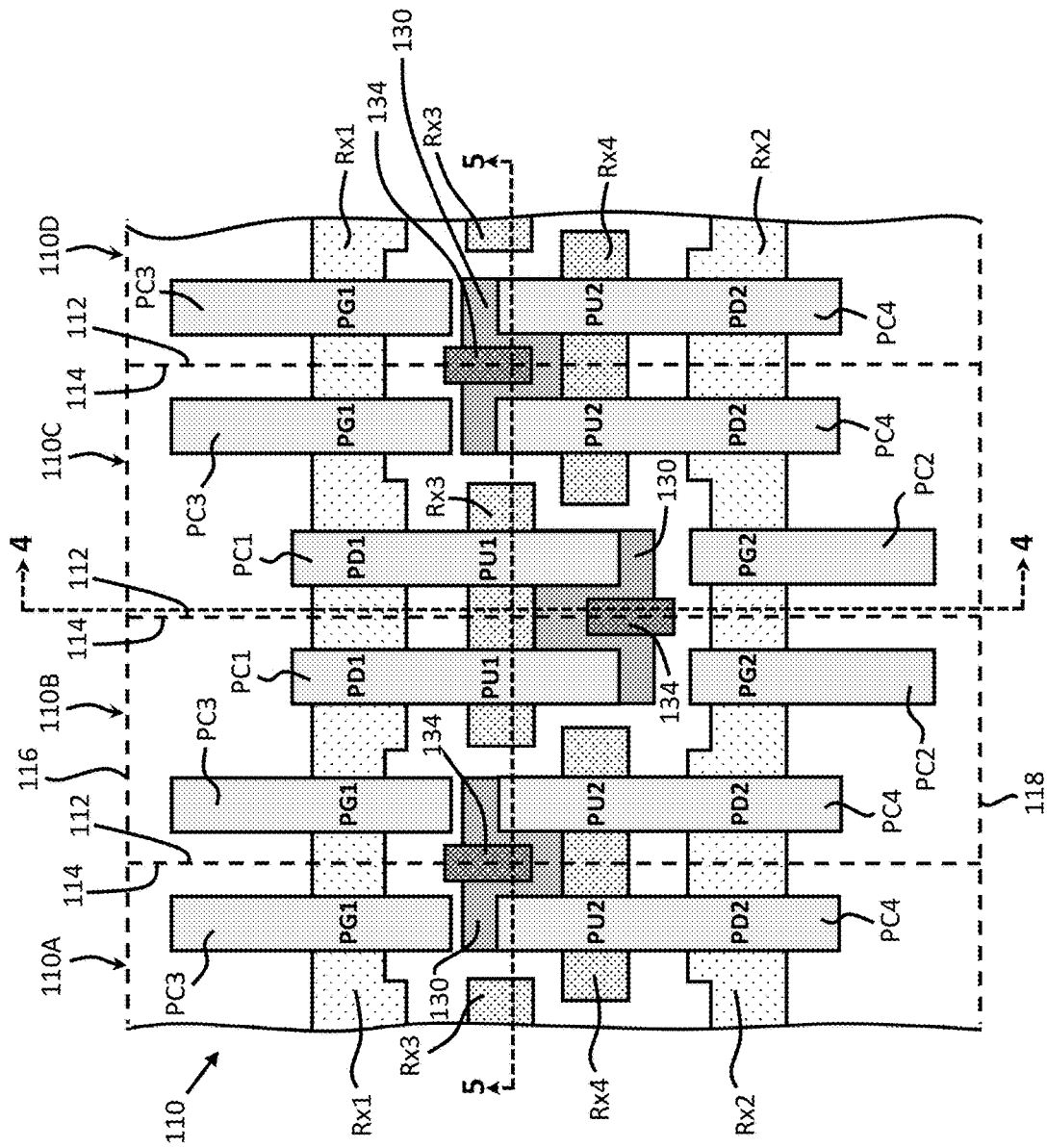
FIG. 3 illustrates an exemplary array of exemplary 6T SRAM bitcells fabricated on a SOI substrate according to the present disclosure.

FIGS. 3-5 illustrate an exemplary embodiment of an array 110 of 6T SRAM bitcells 110A, 110B, 110C and 110D formed on a semiconductor substrate 120 according to the present disclosure. As described further below, the bitcells 110A, 110B, 110C and 110D provide for improved Vmin, yield and writeability, DM and/or SNM. The SRAM bitcells 110A, 110B, 110C and 110D include the first, second, third and fourth active regions Rx1, Rx2, Rx3 and Rx4 and the first, second, third and fourth PC constructs PC1, PC2, PC3 and PC4, and the layout and configuration thereof, of the bitcells 10A, 10B, 10C and 10D described above with respect to FIGS. 1 and 2. The bitcells 110A, 110B, 110C and 110D also include the BP region 126 formed directly under (and corresponding in shape, size, layout, etc., to) the first, second, third and/or fourth active regions Rx1, Rx2, Rx3, Rx4, the p-well PW 124 and deep n-well DNW 122 formed on a semiconductor substrate 120 as described above with respect to bitcells 10A, 10B, 10C and 10D, as shown in FIGS. 4 and 5, and therefore like reference numerals preceded with "1" are used to indicate like aspects or functions, and the description above directed to such aspects or functions (and the alternative embodiments thereof) equally applies to array 110 and bitcells 110A, 110B, 110C and 110D.

As shown in FIGS. 3-5, the bitcells 110A, 110B, 110C and 110D differ from the array of bitcells 10A, 10B, 10C and 10D of FIGS. 1 and 2 in that bitcells 110A, 110B, 110C and 110D include shallow trench isolation regions or portions (STI) 130 associated with the first and second pull-up transistors PU1, PU2. Each bitcell 110A, 110B, 110C and 110D includes separate and distinct first and second STIs 130, 130 associated with the first and second pull-up transistors PU1, PU2, respectively. In the illustrated embodiment, the STIs 130, 130 of each bitcell 110A, 110B, 110C and 110D is not associated with any transistors other than the first and second pull-up transistors PU1, PU2. As shown in FIG. 3, each STI 130 extends across the junction of the second side 14 and the first side 12 along the width direction of laterally adjacent bitcells 110A, 110B, 110C and 110D. In this way, laterally adjacent bitcells 110A, 110B, 110C and 110D share an STI 130 corresponding to their shared third or fourth active region Rx3, Rx4 associated with the respective pull-up transistor PU1 or PU2. The STIs 130 may be formed of a dielectric material. In some embodiments, the dielectric material of the STIs 130 may be an oxide. In some embodiments, the dielectric material of the STIs 130 may be Si-oxide, Si-nitride, Si-oxynitride, or a combination thereof.

As shown in FIGS. 3 and 4, each STI 130 may extend from a respective one of the third or fourth active region Rx3, Rx4 associated with the respective pull-up transistor PU1 or PU2 along the length direction. In some other embodiments, each STI 130 may be spaced from a respective one of the third or fourth active region Rx3, Rx4. The STIs 130 may extend from a respective one of the third or fourth active region Rx3, Rx4 along the length direction toward the second or first active region Rx2, Rx1, respectively, such as the narrow portion thereof, as shown in FIGS. 3 and 4. The STIs 130 may be spaced along the length direction from the respective second or third PC construct PC2, PC3 associated with the respective one of the third or fourth active region Rx3, Rx4, as shown in FIGS. 3 and 4. Each bitcell 110A, 110B, 110C and 110D may thereby include a first STI 130 extending from the third active region Rx3 along the length direction toward the narrow portion of the second active region Rx2 and the bottom side 18 such that the end of the first STI 130 along the length direction proximate to the second active region Rx2 and the bottom side 18 is spaced from the second PC construct PC2, as shown in FIGS. 3 and 4. Further, each bitcell 110A, 110B, 110C and 110D may thereby also include a second STI 130 extending from the fourth active region Rx4 along the length direction toward the narrow portion of the first active region Rx1 and the top side 16 such that the end of the first STI 130 along the length direction proximate to the first active region Rx1 and the top side 16 is spaced from the third PC construct PC3, as shown in FIG. 3.

As noted above, each STI 130 may be positioned and configured such that it spans the junction of laterally adjacent bitcells 110A, 110B, 110C and 110D and along a respective one of the third or fourth active regions Rx3, Rx4 in the width direction. As shown in FIGS. 3 and 5, each STI 130 may extend along the width direction to the lateral side of the respective first or second PC constructs PC1, PC1 or PC2, PC2 associated with the respective third or fourth active region Rx3 or Rx4 of the first or second pull-up transistors PU1, PU1 or PU2, PU2 from which the STI 130 extends. In this way, the side edges (along the width direction) of the STIs 130 may be aligned with the sides edges (along the width direction) of the respective PC constructs (i.e., the first or second PC constructs PC1, PC1 or PC2, PC2) forming the pull-up transistors (i.e., PU1, PU1 or PU2, PU2) associated with the respective STIs 130, as shown in FIGS. 3 and 5. As shown in FIG. 3, the third or fourth active region Rx3 or Rx4 may extend past the lateral sides along the width direction of the STI 130 associated therewith (and the lateral sides along the width direction of the associated first or second PC constructs PC1, PC1 or PC2, PC2).

As shown in FIGS. 4 and 5, the STIs 130 of each bitcell 110A, 110B, 110C and 110D may extend in the thickness direction into a portion of the thickness of the BP region 126. As also shown in FIGS. 4 and 5, the each STI 130 may extend above the respective third or fourth active region Rx3 or Rx4 in the thickness direction. In some embodiments, the first PC constructs associated with the first pull-up transistors PU1, PU1 or the fourth PC constructs associated with the second pull-up transistors PU2, PU2 may extend over the STI 130 associated therewith, as shown in FIG. 5. In some embodiments, each bitcell 110A, 110B, 110C and 110D may include a deep trench isolation region or portion (DTI) 128 extending from the lateral side edges along the width direction to the adjacent third or fourth active region Rx3 or Rx4. Similarly, each bitcell 110A, 110B, 110C and 110D may include a DTI 128 extending from the longitudinal edge opposing the associated third or fourth active region Rx3 or Rx4 along the length direction to the respective one of the adjacent second active region Rx2 and second PC constructs PC2 or adjacent first active region Rx1 and third PC constructs PC3.

The bitcells 110A, 110B, 110C and 110D further differ from the array of bitcells 10A, 10B, 10C and 10D of FIGS. 1 and 2 in that bitcells 110A, 110B, 110C and 110D include a contact to back-plate (CBP) 134 associated with each STI 130. As shown in FIGS. 3-5, each STI 130 may include a CBP 134 extending from within the BP region 126 and through or within the associated STI 130 along the thickness direction. In this way, each STI 130 may abut and extend partially about a respective CBP 134 (along the length and/or width directions). Each CBP 134 and associated STI 130 may extend from the same depth from within the BP region 126 along the thickness direction, as shown in FIGS. 4 and 5. The contact to CBPs 134 may be formed of a conductive material. In some embodiments, the conductive material of the CBPs 134 may be Tungston (W), a metal-nitride (e.g., TiN, WN, etc.), or a combination thereof. In some embodiments, the conductive material of the CBPs 134 may be doped silicon.

Figure 6:
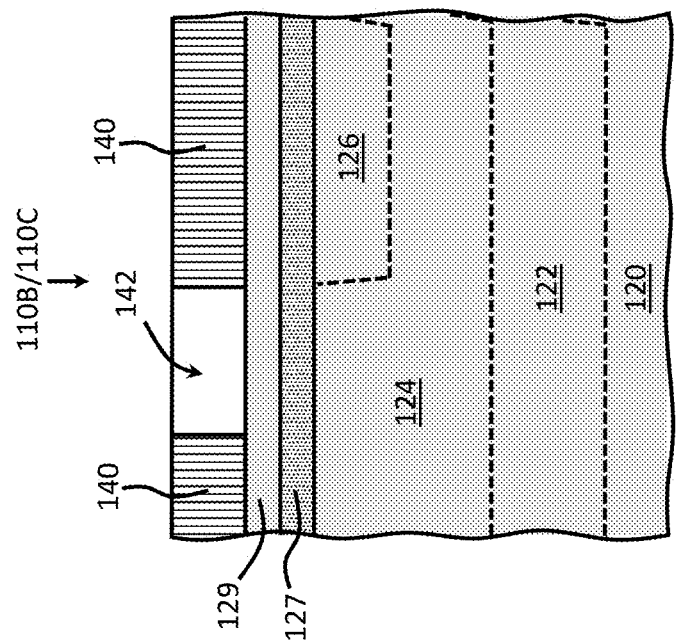
FIG. 6 illustrates an exemplary method of fabricating the bitcell array of FIG. 3 according to the present disclosure.

As shown in FIGS. 5 and 6, each CBP 134 may extend past the PC constructs (e.g., PC1 and PC4) along the thickness direction (i.e., the CBPs 134 may be higher than the PC constructs). As shown in FIG. 5, each CBP 134 may extend from a medial portion of the respective STI 130 along the width and length directions. Each CBP 134 may be spaced from the respective third or fourth active region Rx3 or Rx4 along the length direction, and spaced (e.g., potentially evenly spaced) between the respective first or second PC constructs PC1, PC1 or PC2, PC2 associated with respective first or second pull-up transistors PU1, PU1 or PU2, PU2.

As shown in FIG. 3, each CBP 134 may be offset along the length direction with respect to the associated STI 130. Each CBP 134 may extend from a medial portion of the respective STI 130 and past the longitudinal edge of the associated STI 130 along the length direction proximate to the respective first or second active region Rx1 or Rx2 (e.g., proximate to the narrow portion of the respective first or second active region Rx1 or Rx2). In this way, each CBP 134 may extend past the respective STI 130 along the length direction. In some embodiments, the longitudinal edge of each CBP 134 that is spaced from the respective STI 130 along the length direction may be spaced from the respective second active region Rx2 and second PC constructs PC2, PC2 forming the second pass gate transistors PG2, PG2 or the first active region Rx1 and third PC constructs PC3, PC3 forming the first pass gate transistors PG1, PG1. In the arrangement shown in FIGS. 3-4, the CBPs 134 are configured such that they do not necessitate an increase to the layout area of the bitcells 110A, 110B, 110C and 110D (e.g. along the length and width directions). As shown in FIG. 4, the CBPs 134 may be spaced and isolated from the respective first or second active region Rx1 or Rx2 by a DTI 128 along the length direction, and spaced and isolated from adjacent respective third or fourth active regions Rx3, Rx3 or Rx4, Rx4 by DTIs 128, 128 along the width direction.

As shown in FIG. 4, the CBPs 134 may be spaced and partially isolated from the associated third or fourth active region Rx3 or Rx4 by the respective STI 130. For example, while a STI 130 physically spaces a respective CBP 134 from the associated third or fourth active region Rx3, Rx4, the CBP 134 is in contact with the BP region 126, which extends below the STI 130 and proximate to the third or fourth active region Rx3 or Rx4 associated with the first and second pull-up transistors PU1, PU2, respectively, of each bitcell 110A, 110B, 110C and 110D. As shown in FIGS. 4 and 5, the bitcells 110A, 110B, 110C and 110D also differ from the array of bitcells 10A, 10B, 10C and 10D of FIGS. 1 and 2 in that bitcells 110A, 110B, 110C and 110D include the BP regions 126 below the STIs 130 and the CBPs 134 thereof. Each bitcell 110A, 110B, 110C and 110D thereby includes the BP regions 126 below the first, second, third and fourth active regions Rx1, Rx2, Rx3 and Rx4 and the STIs 130 and the CBPs 134. In this way, the size, shape, layout, location, etc. of the BP regions 126 may be formed to correspond to that of the first, second, third and fourth active regions Rx1, Rx2, Rx3 and Rx4 and the STIs 130 and the CBPs 134. As noted above, the bitcells 10A, 10B, 10C and 10D of FIGS. 1 and 2 only include the BP regions 126 below the first, second, third and fourth active regions Rx1, Rx2, Rx3 and Rx4. The CBPs 134 of each bitcell 110A, 110B, 110C and 110D may thereby provide contacts to the BP regions 126 associated with the first and second pull-up transistors PU1, PU2 of the respective bitcell 110A, 110B, 110C and 110D.

In this way, during a read operation of a bitcell 110A, 110B, 110C and 110D a grounding voltage or lower can be dynamically applied to at least one of the CBPs 134, and thereby the associated BP region(s) 126, to dynamically negatively bias at least one of the first and second pull-up transistors PU1, PU2 through the BOX layer 127 (e.g., the BP regions 126 below the BOX layer 127 under at least the respective channels thereof). The electrical potential applied to at least one of the CBPs 134 may thereby pass or be transferred to at least one of the first and second pull-up transistors PU1, PU2 through the associated at least one BP region 126 and BOX layer 127 to effect operation of at least one of the first and second pull-up transistors PU1, PU2. Stated differently, the potential of at least one of the CBPs 434 can bias or effect at least one of the first and second pull-up transistors PU1, PU2 through or via the associated at least one BP region 126 and BOX layer 127 to effect operation of at least one of the first and second pull-up transistors PU1, PU2.

The negative bias to the regions 126 associated with the first and second pull-up transistors PU1, PU2 may form a stronger pFET and, thereby, improve the readability SNM and beta cell ratio of the bitcell 110B. Conversely, during a write operation of a bitcell, such as bitcell 110B for example, a positive voltage can be dynamically applied to the CBPs 134 of bitcell 110B, to dynamically positively bias the BP regions 126 associated with first and second pull-up transistors PU1, PU2 of bitcell 110B through the BOX layer 127. The positive bias to the BP regions 126 associated with the first and second pull-up transistors PU1, PU2 may form a weaker pFET and, thereby, improve the writeability SNM and gamma ratio of the bitcell 110B. The negative and positive biases applied to the BP regions 126 associated with first and second pull-up transistors PU1, PU2 of the bitcells 110A, 110B, 110C and 110D via the CBPs 134 may thereby improve the Vmin and yield of the bitcells 110A, 110B, 110C and 110D.

FIGS. 6-11 illustrate an exemplary method of fabricating the array of bitcells 110A, 110B, 110C and 110D. FIGS. 6-11 illustrate a fabrication method via a cross-sectional view taken along a portion of the length of one of exemplary bitcells 110B or 110C. As one of ordinary skill in the art would recognize, the method is also performed along the entire length and width of the bitcells 110A, 110B, 110C and 110D. Similarly, one of ordinary skill in the art would recognize that the method may be adapted or varied, while leaving the main fabrication principle intact, to produce the particular arrangement or layout of other portions of bitcells 110B or 110C or of other bitcells, such as bitcells 110A and 110D.

As shown in FIG. 6, a method of forming or fabricating the array of bitcells 110A, 110B, 110C and 110D may include obtaining an intermediate semiconductor structure with the SOI substrate including the semiconductor substrate 120, the DNW layer 122 formed over at least a portion of the substrate 120, the PW layer 124 formed over at least a portion of the layer of DNW 122, and the BP regions 126 (as n+ back-plate) formed over/within at least a portion of the layer of PW 124. The PW layer 124, BP regions 26, DNW layer 122 of the SOI substrate may be underneath BOX layer 127 (e.g., a dielectric layer) of the SOI substrate. An active region material layer 129, that forms active regions Rx1, Rx2, Rx3 and Rx4, is formed over at least a portion of the BOX layer 127. The BP regions 126 (e.g., N+ regions) may thereby be formed underneath the BOX layer 127 and the and first, second, third and/or fourth active regions Rx1, Rx2, Rx3, Rx4 so as to serve as the "back-plate" of one or more transistors on the SOI substrate. The intermediate semiconductor structure may further include a mask layer 140 formed over at least a portion of the layer of active region material 129.

Figure 7:
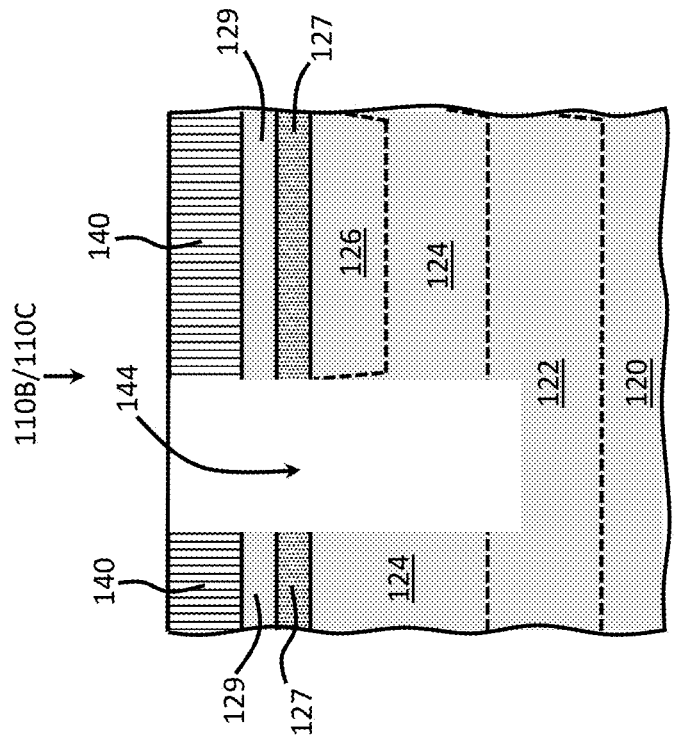
FIG. 7 illustrates an exemplary method of fabricating the bitcell array of FIG. 3 according to the present disclosure.

In some embodiments, the method of fabricating the array of bitcells 110A, 110B, 110C and 110D may include forming the deep trenches for the DTIs 128 before forming the shallow trenches for the STIs 130 and the CBPs 134. For example, as shown in FIG. 6, at least one opening 142 may be formed in the mask layer 140 corresponding to the location and layout of one or more DTIs 128. The at least one opening 142 may be formed after the mask layer 140 is formed, or during the formation of the mask layer 140. The at least one opening 142 in the mask layer 140 may extend to the active region material layer 129 to expose the active region material layer 129, as shown in FIG. 6. As shown in FIG. 7, the at least one opening 142 in the mask layer 140 may be utilized to form at least one corresponding deep trench 144 that extends the at least one opening 142 at least through the active region material layer 129, through the BOX layer 127, through the PW layer 124 and at least to (potentially partially into) the DNW layer 122. Depending upon the particular DTI 128 ultimately formed via the at least one deep trench 144, as explained further below, the at least one deep trench 144 may be formed in a location and layout such that it extends through the BP regions 126, or may extend through a portion of the intermediate semiconductor device that is void of the BP regions 126 as depicted in FIG. 7. The at least one deep trench 144 may be formed via the at least one opening 142 via any method, such as via an etch process.

As shown in FIG. 8, the at least one deep trench 144 may be utilized to form at least one shallow trench 148 ultimately utilized to form at least one corresponding STI 130. The at least one shallow trench 148 may be formed by forming a photoresist layer 146 over the mask layer 140 and within the at least one deep trench 144. The photoresist layer 146 may then be patterned (e.g., via exposure to light) such that at least one portion thereof corresponding to at least one location and layout of at least one desired STI 130 is soluble to a photoresist developer. The at least one soluble portion of the photoresist layer 146 may be removed and utilized to remove at least one corresponding portion of the mask layer 140 and the BOX layer 127 underlying the at least one soluble portion of the photoresist layer 146 to form the at least one shallow trench 148, as shown in FIG. 8. After formation of the at least one shallow trench 148 as shown in FIG. 8, the remaining portion of the photoresist layer 146 may be removed to expose the mask layer 140 and the at least one deep trench 144 as shown in FIG. 9.

Figure 10:
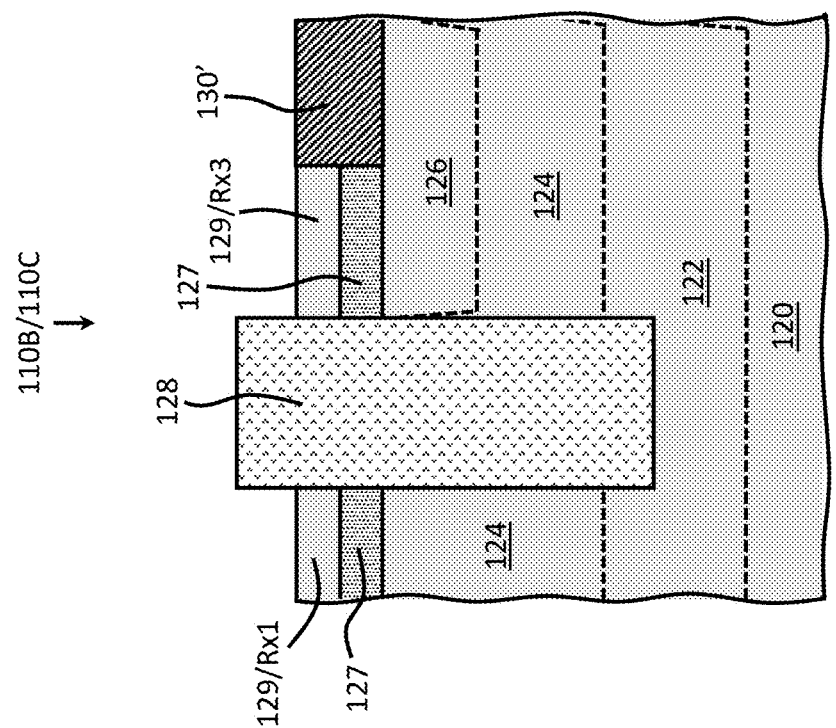
FIG. 10 illustrates an exemplary method of fabricating the bitcell array of FIG. 3 according to the present disclosure.

After formation of the at least one shallow trench 148 and removal of the photoresist layer 146 from the mask layer 140 and the at least one deep trench 144, as shown in FIG. 10 the at least one deep trench 144 may be filled with at least one oxide material (e.g., silicon dioxide) to form at least one DTI 128, the at least one shallow trench 148 may be filled with at least one oxide material (e.g., silicon dioxide) to form at least one intermediate STI 130', and the mask layer 140 may be removed (e.g., via etching, CMP, etc.) from the active region material layer 129. The at least one DTI 128 may be formed such that the top surface thereof is positioned above the top surface of the active region material layer 129, as shown in FIG. 10. As also shown in FIG. 10, the at least one intermediate STI 130' may be formed such that the top surface thereof is substantially flush with the top surface of the active region material layer 129. At least one portion of the active material layer 129 may be isolated between an intermediate STI 130' and an DTI 128 to form an active region of the corresponding bitcell, such as the third active region Rx3 of bitcells 110B or 110C as shown in FIG. 10. Similarly, the portion of the active material layer 129 positioned on the opposing side of a DTI 128 as compared to the at least one intermediate STI 130' may form another active region of the corresponding bitcell, such as the first active region Rx1 of bitcells 110B or 110C as shown in FIG. 10.

Figure 11:
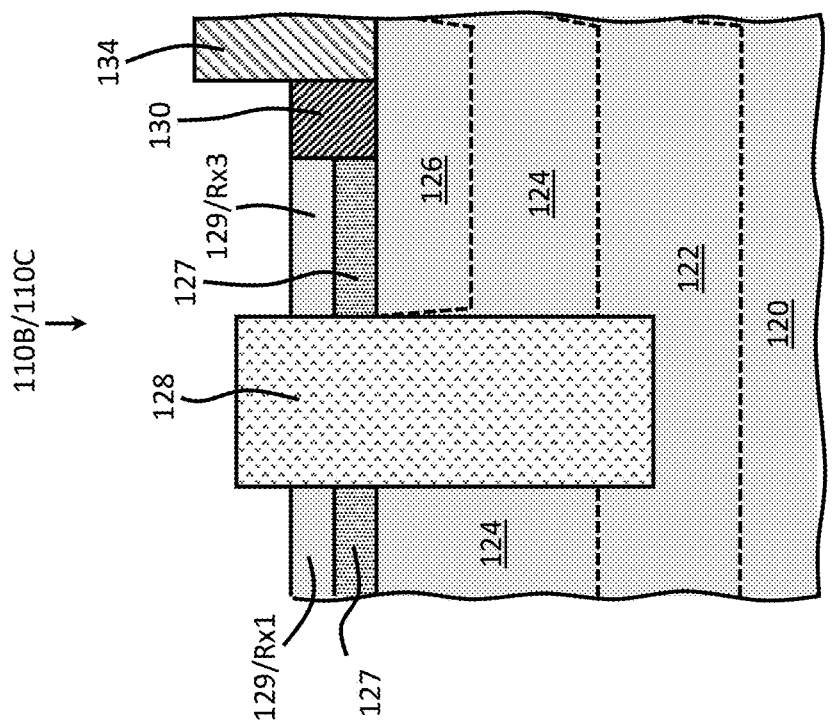
FIG. 11 illustrates an exemplary method of fabricating the bitcell array of FIG. 3 according to the present disclosure.

With the at least one DTI 128 and the at least one intermediate STI 130' formed (and the mask layer 140 removed), at least a portion of the at least one intermediate STI 130' extending to the BP regions 126 may be remove. The space created by the removal of the portion of the at least one intermediate STI 130' may then be filled with a metal material to form the at least one STI 130 and the at least one CBP 134 to form the bitcell(s), such as the second and third bitcells 110B, 110C as shown in FIG. 11.

Figure 12:
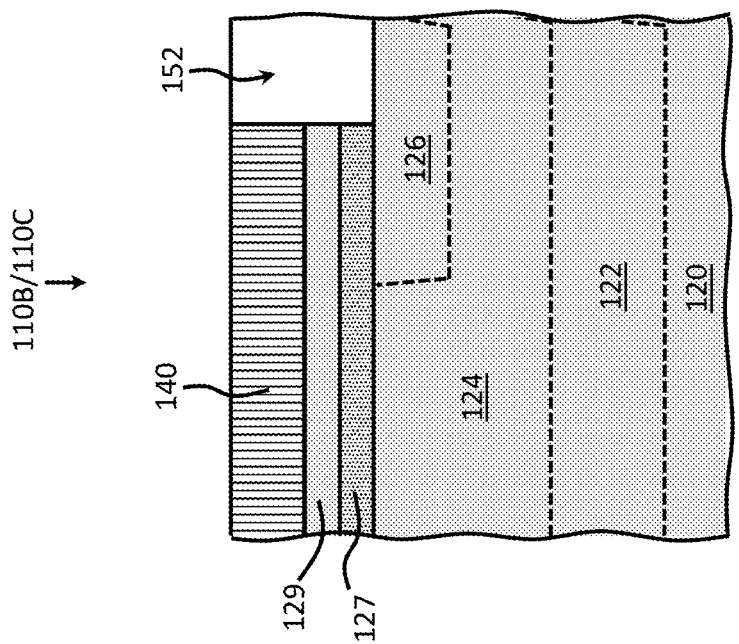
FIG. 12 illustrates another exemplary method of fabricating the bitcell array of FIG. 3 according to the present disclosure.

FIGS. 12-15 illustrate another embodiment of an exemplary method of fabricating the array of bitcells 110A, 110B, 110C and 110D. The fabrication method of FIGS. 12-15 differs from the fabrication method of FIGS. 6-11 in the order of the formation of the at least one deep trench 144 and the at least one shallow trench 148 (as depicted in FIGS. 6-9). As shown in FIGS. 12-15, in some embodiments the method of fabricating the array of bitcells 110A, 110B, 110C and 110D may include forming the shallow trenches 152 for the STIs 130 and the CBPs 134 before forming the deep trenches 156 for the DTIs 128. For example, as shown in FIG. 12, at least one shallow trench 152 may be formed through the mask layer 140, the active region material layer 129 and the BOX layer 127 and at least to the BP regions 126. The mask layer 140 may be utilized to create the at least one shallow trench 152. The at least one shallow trench 152 may thereby corresponding to the location and layout of one or more DTI 128 and CBP 134.

Figure 13:
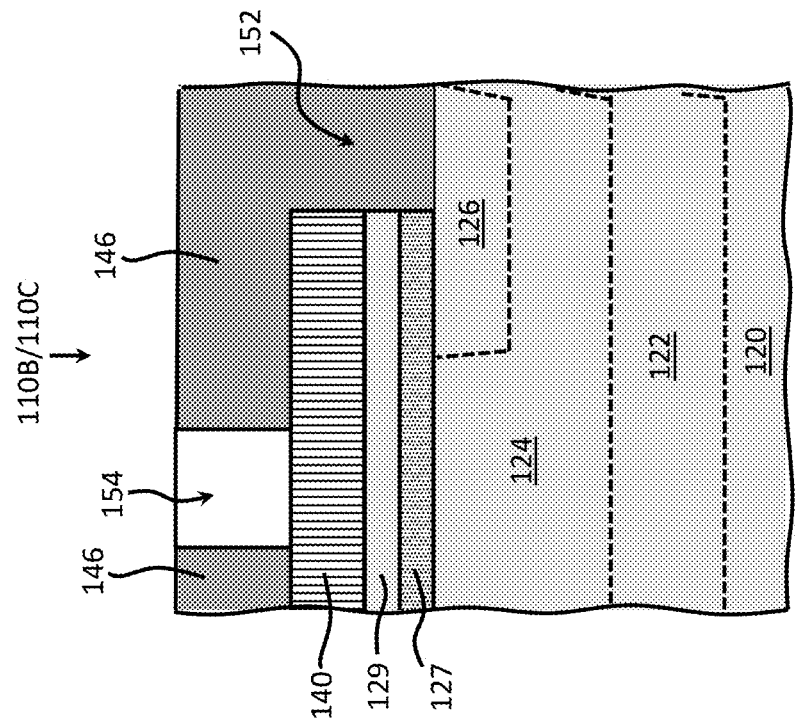
FIG. 13 illustrates another exemplary method of fabricating the bitcell array of FIG. 3 according to the present disclosure.

After formation of the at least one shallow trench 152, the at least one deep trench 156 may be formed by forming a photoresist layer 146 over the mask layer 140 and within the at least one shallow trench 152, as shown in FIG. 13. As also shown in FIG. 13, the photoresist layer 146 may be patterned or otherwise configured such that at least one opening 154 extending to the mask layer 140 is formed. The at least one deep trench 156 of the photoresist layer 146 may be utilized to remove at least one corresponding portion of the mask layer 140, the BOX layer 127, the active region material layer 129, the BOX layer 127 and the PW layer 124, as shown in FIG. 14. The at least one deep trench 156 may or may not extend into the DNW 122. Further, as shown in FIG. 14, the at least one deep trench 156 may extend adjacent to the BP regions 126. In some other embodiments, the at least one deep trench 156 may extend through the BP regions 126. The at least one deep trench 156 may be utilized to create the DTIs 128. The at least one shallow deep trench 156 may thereby corresponding to the location and layout of at least one DTI 128.

After formation of the at least one deep trench 156 as shown in FIG. 14, any remaining portion of the photoresist layer 146 may be removed to expose the mask layer 140 and the at least one deep trench 146 as shown in FIG. 15. The at least one shallow trench 152 and the at least one deep trench 156 may be utilized to form the at least one DTI 128 and the at least one STI 130 and CBP 134, respectively, as shown in FIGS. 10 and 11 and described above.

Figure 16:
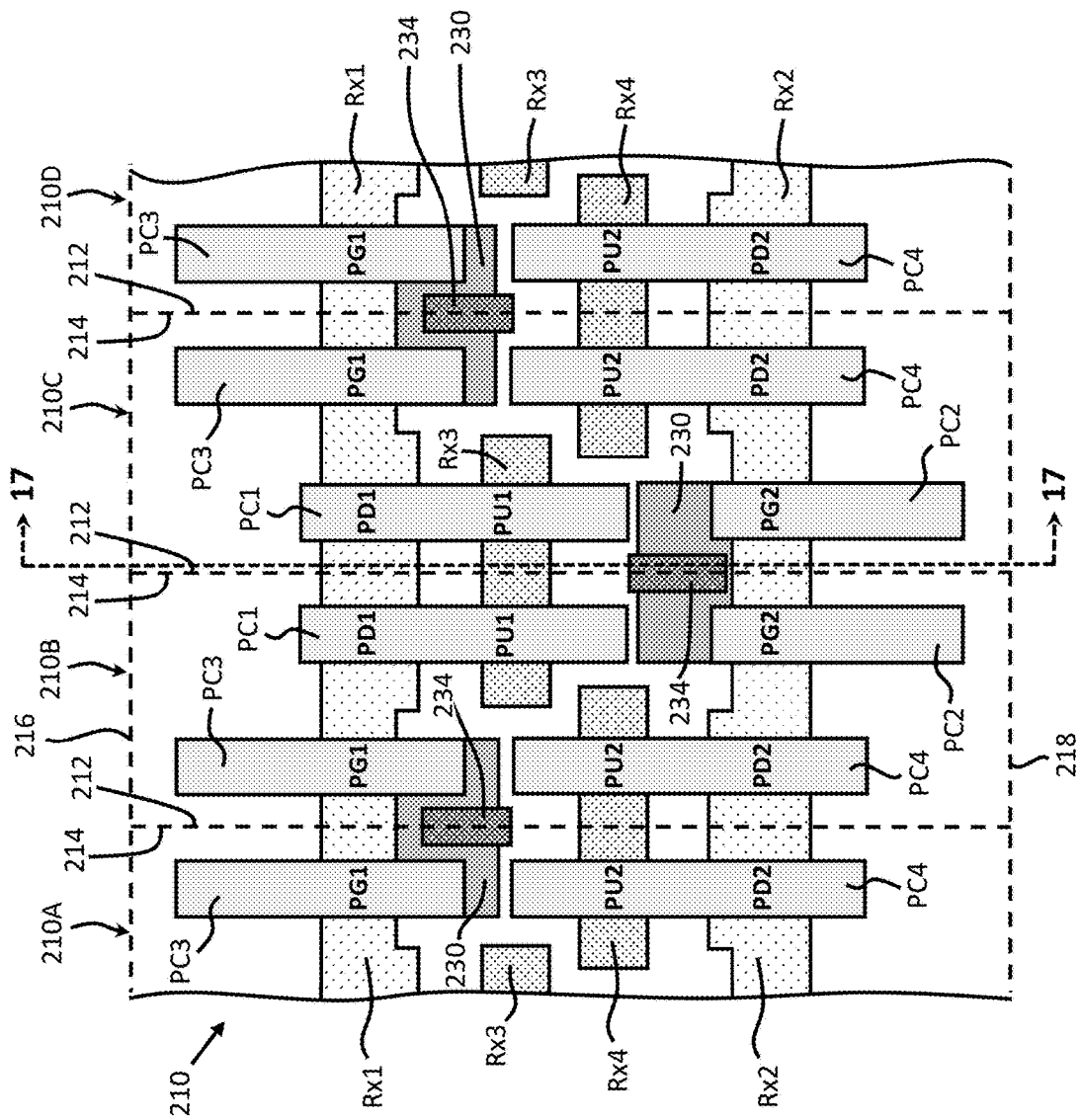
FIG. 16 illustrates an exemplary array of exemplary 6T SRAM bitcells according to the present disclosure.
Figure 17:
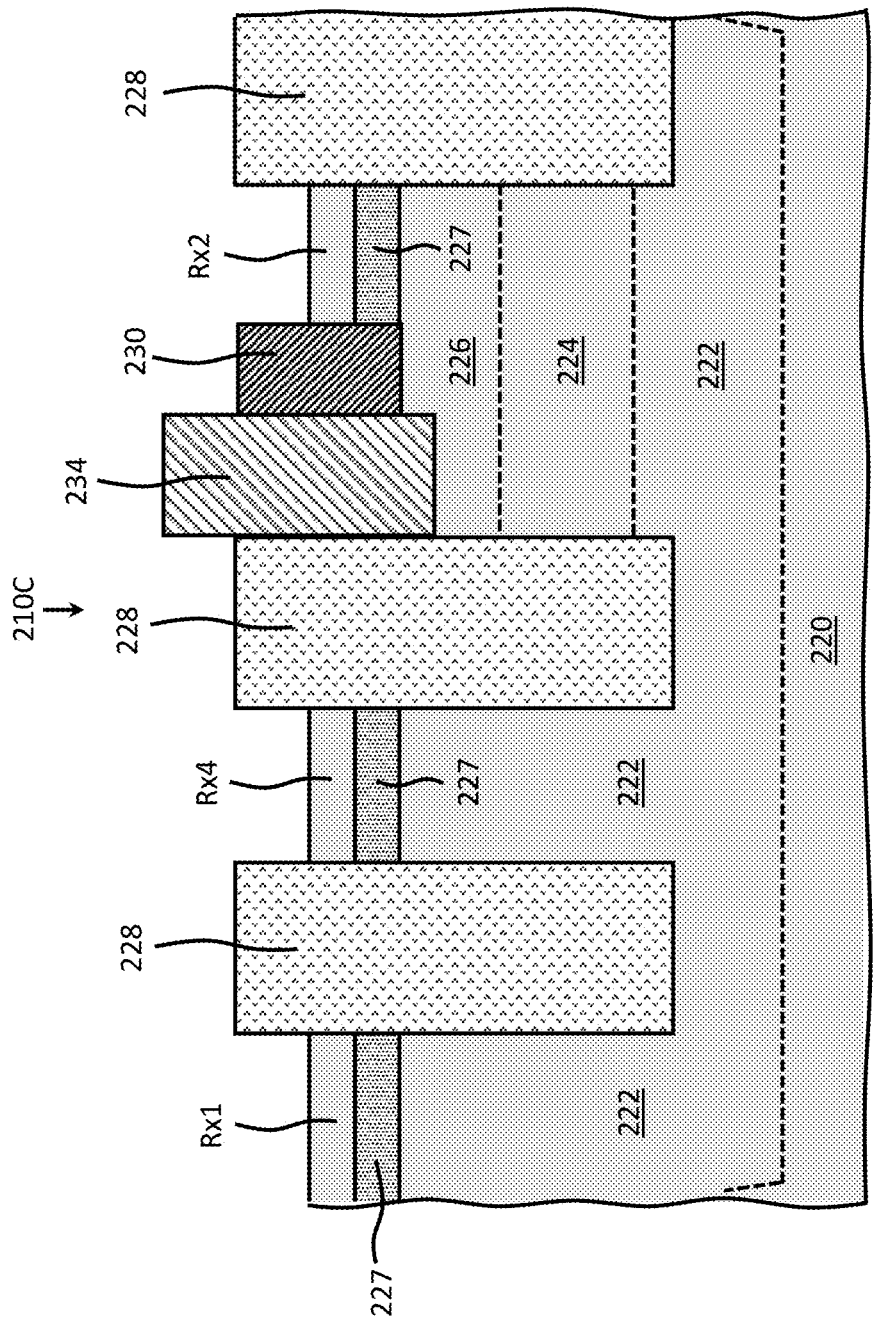
FIG. 17 illustrates a cross-sectional view of a portion of the bitcell array of FIG. 16.

FIGS. 16 and 17 illustrate an array 200 of 6T SRAM bitcells 210A, 210B, 210C and 210D formed on a semiconductor substrate 120 according to the present disclosure. The bitcells 210A, 210B, 210C and 210D of FIGS. 16 and 17 are substantially similar to the array 100 of 6T SRAM bitcells 110A, 110B, 110C and 110D described above with respect to FIGS. 3-15, and therefore like reference numerals preceded with "2" are used to indicate like aspects, functions and the like, and the description above directed to aspects, functions and the like thereof (and the alternative embodiments thereof) equally applies to bitcells 210A, 210B, 210C and 210D. As shown in FIGS. 16 and 17, bitcells 210A, 210B, 210C and 210D differ from bitcells 110A, 110B, 110C and 110D in the layout or configuration of the DTIs 128 and CBPs 134.

As shown in FIGS. 16 and 17, the DTIs 128 and CBPs 134 are configured to bias the first and second pass gate PG1, PG2 transistors of the bitcells 210A, 210B, 210C and 210D. For example, in the illustrated embodiment the STIs 230, 230 of each bitcell 210A, 210B, 210C and 210D are not associated with any transistors other than the first and second pass gate transistors PG1, PG2. As shown in FIG. 17, each STI 230 extends across the junction of the second side 214 and the first side 212 along the width direction of laterally adjacent bitcells 210A, 210B, 210C and 210D. In this way, laterally adjacent bitcells 210A, 210B, 210C and 210D share an STI 230 corresponding to their shared first or second active region Rx1, Rx2 associated with the respective first and second pass gate transistors PG1, PG2.

Figure 18:
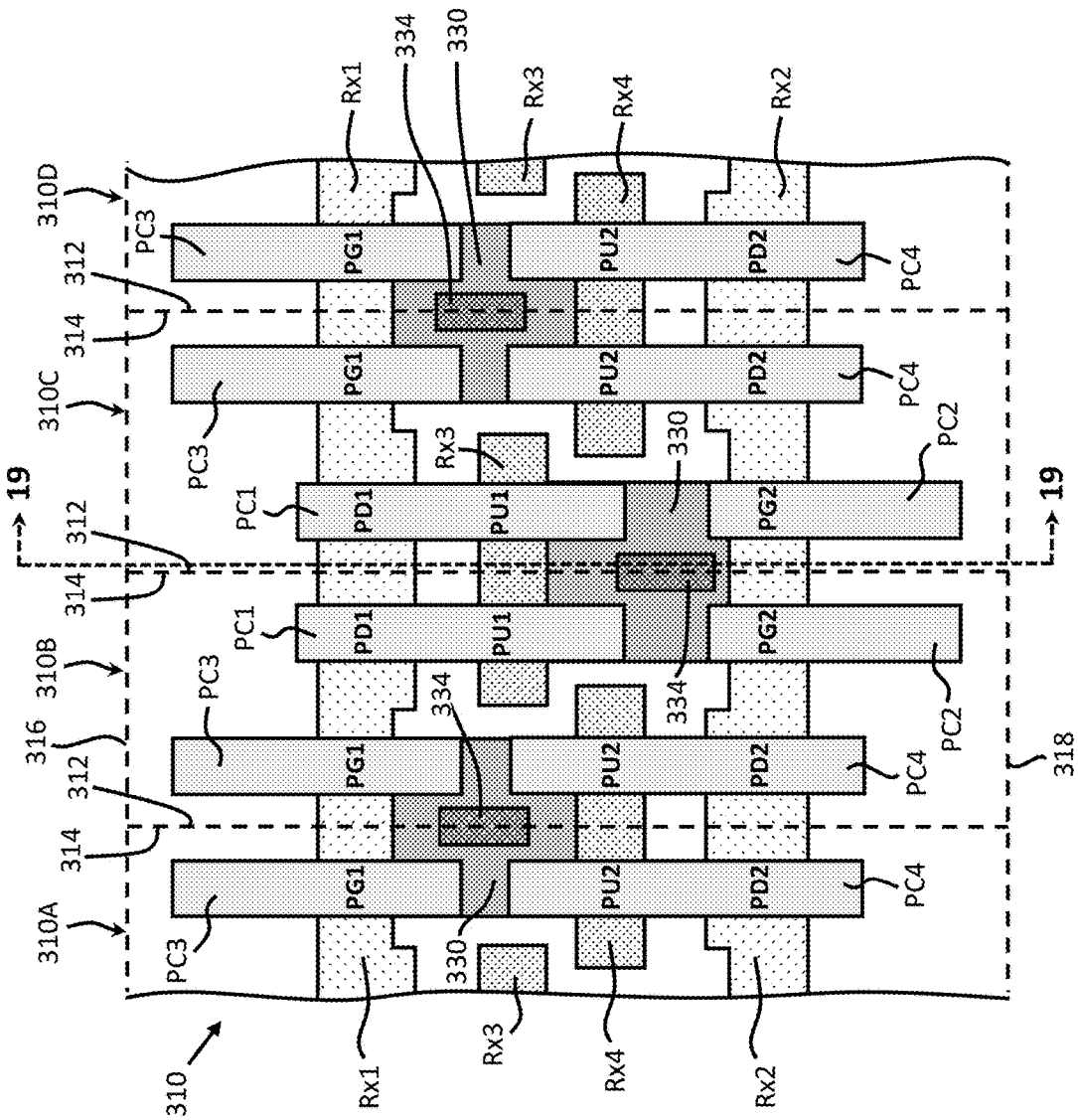
FIG. 18 illustrates an exemplary array of exemplary 6T SRAM bitcells according to the present disclosure.

As shown in FIG. 17, each STI 230 may extend from a respective one of the first or second active region Rx1, Rx2 associated with the respective first or second pass gate transistor PG1, PG2 along the length direction, such as the narrow portion thereof. In some other embodiments, each STI 230 may be spaced from a respective one of the first or second active region Rx1, Rx2. The STIs 230, 230 may extend from a respective one of the first or second active region Rx1, Rx2 along the length direction toward the fourth or third active region Rx4, Rx3, respectively, as shown in FIGS. 17 and 18. The STIs 130 may be spaced along the length direction from the respective fourth or first PC construct PC4, PC1 associated with the respective one of the fourth or third active region Rx4, Rx3, as shown in FIGS. 16 and 17. Each bitcell 210A, 210B, 210C and 210D may thereby include a first STI 230 extending from the first active region Rx1 along the length direction toward the fourth active region Rx4 and the bottom side 218 such that the end of the first STI 230 along the length direction proximate to the fourth active region Rx2 and the bottom side 218 is spaced from the fourth PC construct PC2 (and the fourth active region Rx4), as shown in FIG. 17. Further, each bitcell 210A, 210B, 210C and 210D may thereby also include a second STI 230 extending from the second active region Rx2 (e.g., the narrow portion thereof) along the length direction toward the third active region Rx3 and the top side 216 such that the end of the second STI 230 along the length direction proximate to the third active region Rx3 and the top side 216 is spaced from the first PC construct PC1 (and the third active region Rx3), as shown in FIGS. 16 and 17.

As noted above, each STI 230 may be positioned and configured such that it spans the junction of laterally adjacent bitcells 210A, 210B, 210C and 210D and along a respective one of the first or second active regions Rx1, Rx2 along the width direction. As shown in FIG. 16, each STI 230 may extend along the width direction to the outer lateral sides of the respective third or second PC constructs PC3, PC3 or PC2, PC2 associated with the respective one of the first or second active region Rx1, Rx1 of the first or second pass gate transistors PG1, PG1 or PG2, PG2, respectively, from which the STI 230 extends. In this way, the side edges (along the width direction) of the STIs 130 may be aligned with the sides edges (along the width direction) of the respective PC constructs (i.e., the second or third PC constructs PC2, PC2 or PC3, PC3) forming the first or second transistors associated therewith (i.e., PG1, PG1 or PG2, PG2), respectively, as shown in FIG. 17.

The bitcells 210A, 210B, 210C and 210D may further differ from the array of bitcells 110A, 110B, 110C and 110D in the position or layout of the CBPs 234, 234 of each bitcell 210A, 210B, 210C and 210D. Each STI 230 may abut and extend partially about a respective CBP 234 (along the length and/or width directions). As shown in FIG. 16, each CBP 234 may extend from a medial portion of the respective STI 230 along the width and length directions. Each CBP 234 may be spaced from the respective first or second active region Rx1 or Rx2 along the length direction, and spaced (e.g., potentially evenly spaced) between the respective third or second PC constructs PC3, PC3 or PC2, PC2 associated with respective first or second pass gate transistors PG1, PG1 or PG2, PG2.

As shown in FIGS. 16 and 17, each CBP 234 may be offset along the length direction with respect to the associated STI 230. Each CBP 234 may extend from a medial portion of the respective STI 230 and past the longitudinal edge of the associated STI 230 along the length direction proximate to the respective third or fourth active region Rx3 or Rx4. In this way, each CBP 234 may extend past the longitudinal edge of the respective STI 230 along the length direction opposing the respective first or second active region Rx1, Rx2. In some embodiments, the longitudinal edge of each CBP 234 that is spaced from the respective STI 230 along the length direction may be spaced from the respective fourth active region Rx4 and fourth PC constructs PC4, PC4 forming the second pull-up transistors PU2, PU2 or the third active region Rx3 and first PC constructs PC1, PC1 forming the first pull-up transistors PG1, PG1. In the arrangement shown in FIGS. 16 and 17, the CBPs 234 are configured such that they do not necessitate an increase to the layout area of the bitcells 210A, 210B, 210C and 210D (e.g. along the length and width directions). As shown in FIG. 17, the CBPs 234 may be spaced and isolated from the respective third or fourth active region Rx3, Rx4 by a DTI 228 along the length direction (the CBPs 234 may also be spaced and isolated from adjacent respective first or second active regions Rx1, Rx1 or Rx2, Rx2 by DTIs along the width direction).

As shown in FIGS. 16 and 17, the CBPs 234 may be spaced and partially isolated from the associated first or second active region Rx1, Rx2 by the respective STI 230. For example, while a STI 230 physically spaces a respective CBP 234 from the associated first or second active region Rx1, Rx2, the CBP 234 may be in contact with the BP region 226 which extends below the STI 230 and proximate to the associated first or second active region Rx1, Rx2 associated with the first and second pass gate transistors PG1, PG2, respectively, of each bitcell 210A, 210B, 210C and 210D. As shown in FIGS. 16 and 17, the bitcells 210A, 210B, 210C and 210D also include the BP regions 226 below the STIs 230 and the CBPs 234 thereof. Each bitcell 210A, 210B, 210C and 210D thereby includes the BP regions 226 below the first, second, third and fourth active regions Rx1, Rx2, Rx3 and Rx4 and the STIs 230 and the CBPs 234. In this way, the size, shape, layout, location, etc. of the BP regions 226 may be formed to correspond to that of the first, second, third and fourth active regions Rx1, Rx2, Rx3 and Rx4 and the STIs 230 and the CBPs 234. The CBPs 234 of each bitcell 210A, 210B, 210C and 210D may thereby provide contacts to the BP regions 226 associated with the first and second pass gate transistors PG1, PG2 of the respective bitcells 210A, 210B, 210C and 210D.

In this way, during a read operation of one or more of the bitcells 210A, 210B, 210C and 210D, a grounding voltage or a lower voltage can be dynamically applied to at least one of the CBPs 234, and thereby the associated BP region(s) 226, to dynamically negatively bias at least one of the first and second pass gate transistors PG1, PG2 through the BOX layer 227. The electrical potential applied to at least one of the CBPs 234 may thereby pass or be transferred to at least one of the first and second pass gate transistors PG1, PG2 through the associated at least one BP region 226 and BOX layer 227 to effect operation of at least one of the first and second pass gate transistors PG1, PG2. Stated differently, the potential of at least one of the CBPs 234 can bias or effect at least one of the first and second pass gate transistors PG1, PG2 through or via the associated at least one BP region 226 and BOX layer 227 to effect operation of at least one of the first and second pass gate transistors PG1, PG2.

The negative bias to the first and second pass gate transistors PG1, PG2 may form a weaker nFET and, thereby, improve the readability SNM and beta cell ratio of the bitcell(s). Conversely, during a write operation of one or more of the bitcells 210A, 210B, 210C and 210D, a positive voltage can be dynamically applied to the CBPs 234, and thereby the associated BP regions 226, to dynamically positively bias the first and second pass gate transistors PG1, PG2 through the BOX layer 227. The positive bias to the first and second pass gate transistors PG1, PG2 may form a stronger nFET and, thereby, improve the writeability SNM, gamma ratio and/or write margin of the bitcell(s). The negative and positive biases applied to the first and second pass gate transistors PG1, PG2 of at least one of the bitcells 210A, 210B, 210C and 210D via the corresponding CBPs 234 may thereby improve the Vmin and yield of the bitcells 210A, 210B, 210C and 210D.

Figure 19:
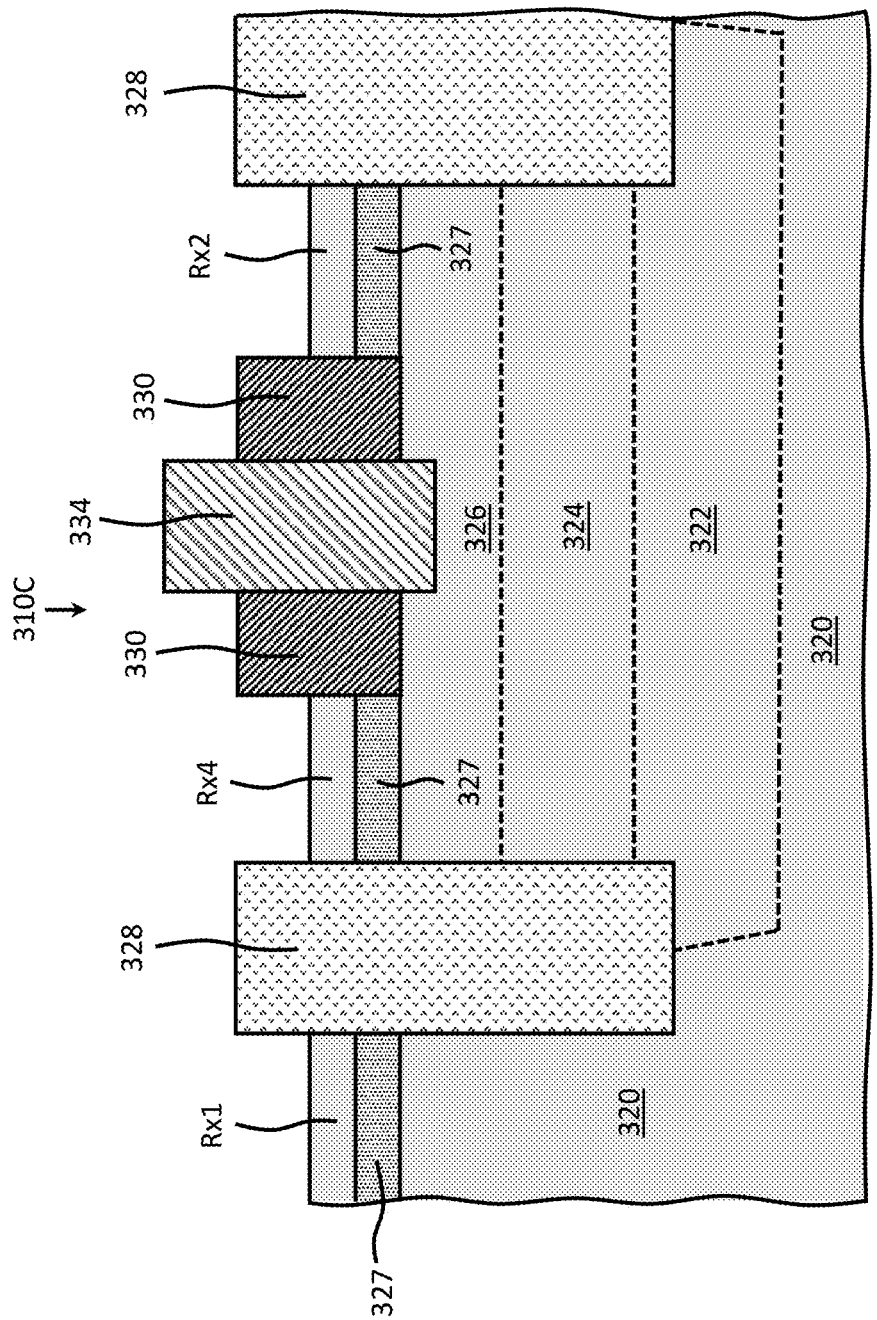
FIG. 19 illustrates a cross-sectional view of a portion of the bitcell array of FIG. 18.

FIGS. 18 and 19 illustrate an array 300 of 6T SRAM bitcells 310A, 310B, 310C and 310D formed on a semiconductor substrate 320 according to the present disclosure. The bitcells 310A, 310B, 310C and 310D of FIGS. 18 and 19 are substantially similar to the array 100 of 6T SRAM bitcells 110A, 110B, 110C described above with respect to FIGS. 3-15 and 110D and the array 200 of 6T SRAM bitcells 210A, 210B, 210C and 210D described above with respect to FIGS. 16 and 17, and therefore like reference numerals preceded with "3" are used to indicate like aspects, functions and the like, and the description above directed to aspects, functions and the like thereof (and the alternative embodiments thereof) equally applies to bitcells 310A, 310B, 310C and 310D. As shown in FIGS. 18 and 119, bitcells 310A, 310B, 310C and 310D differ from bitcells 110A, 110B, 110C and 110D and bitcells 210A, 210B, 210C and 210D in the layout or configuration of the DTIs 328 and CBPs 334.

As shown in FIGS. 18 and 19, bitcells 310A, 310B, 310C and 310D are configured to dynamically bias the first and second pull-up transistors PU1, PU2 and the first and second pass gate transistors PG1, PG2 via the associated DTIs 328 and CBPs 334 (through the BOX layer 327). For example, in the illustrated embodiment the STIs 230, 230 of each bitcell 310A, 310B, 310C and 310D are associated with exclusively the first and second pull-up transistors PU1, PU2 and the first and second pass gate transistors PG1, PG2. As shown in FIG. 18, each STI 230 extends across the junction of the second side 314 and the first side 312 along the width direction of laterally adjacent bitcells 310A, 310B, 310C and 310D. In this way, laterally adjacent bitcells 310A, 310B, 310C and 310D share an STI 330 corresponding to their shared first and third active regions Rx1, Rx3 or second and fourth active regions Rx2, Rx4 associated with the respective first pass gate transistors PG1, PG1 and second pull-up transistors PU2, PU2 or second pass gate transistors PG2, PG2 and first pull-up transistors PU1, PU1.

As shown in FIGS. 18 and 19, each STI 330 may extend from/between the first and fourth active regions Rx1, Rx4 or the second and third active regions Rx2, Rx3 along the length direction, such as from the narrow portions of the first or second active regions Rx1, Rx2. In some other embodiments, each STI 330 may be spaced from an active region. Each bitcell 310A, 310B, 310C and 310D may thereby include a first STI 330 extending between/from the first active region Rx1 (e.g., the narrow portion thereof) and the fourth active region Rx4 along the length direction, and a second STI 330 extending between/from the second active region Rx2 (e.g., the narrow portion thereof) and the third active region Rx3 along the length direction, as shown in FIG. 18.

As shown in FIG. 18, each STI 330 may extend along the width direction to the outer lateral sides of the respective first and second PC constructs PC1, PC1 and PC2, PC2 associated with the second and third active regions Rx2, Rx3 or the third and fourth PC constructs PC3, PC3 and PC4, PC4 associated with the first and fourth active regions Rx1, Rx4. In this way, the side edges (along the width direction) of the STIs 330 may be aligned with the sides edges (along the width direction) of the respective PC constructs (i.e., the first and second PC constructs PC1, PC1 and PC2, PC2 or the third and fourth PC constructs PC3, PC3 and PC4, PC4) forming the first or second transistors associated therewith (i.e., PG1, PG1 and PU2, PU2 or PG2, PG2 and PU1, PU1), as shown in FIG. 18. The STIs 330, 330 of each bitcell 310A, 310B, 310C and 310D may thereby also extend between the longitudinal ends of the first and second PC constructs PC1, PC1 and PC2, PC2 or the third and fourth PC constructs PC3, PC3 and PC4, PC4 along the length direction, as shown in FIG. 18.

The bitcells 310A, 310B, 310C and 310D may further differ from the array 100 of bitcells 110A, 110B, 110C and 110D and the array 200 of the bitcells 210A, 210B, 210C and 210D in the position or layout of the CBPs 334, 334. Each STI 330 may abut and extend about (e.g., entirely about) a respective CBP 334 (along the length and/or width directions). As shown in FIG. 18, each CBP 234 may positioned in a medial portion of the respective STI 330 along the width and length directions. As shown in FIGS. 18 and 19, each CBP 334 may be spaced between the respective first and fourth active regions Rx1, Rx4 or the second and third active regions Rx2, Rx3 along the length direction (e.g., potentially evenly spaced), and spaced between the third and fourth PC constructs PC3, PC3, PC4, PC4 or the first and second PC constructs PC1, PC1, PC2, PC2, respectively, along the width direction (e.g., potentially evenly spaced). Alternatively, each CBP 334 may be offset along the length direction with respect to the associated STI 330.

As shown in FIGS. 18 and 19, the CBPs 334, 334 of each bitcell 310A, 310B, 310C and 310D may be spaced and isolated from the respective first and fourth active regions Rx1, Rx4 or the second and third active regions Rx2, Rx3 along the length direction by respective DTIs 328, 328 (the CBPs 334, 334 may also be spaced and isolated from the respective first and fourth active regions Rx1, Rx4 or the second and third active regions Rx2, Rx3 along the width direction). As shown in FIG. 19, the CBPs 334 may be spaced and partially isolated from the first and fourth active regions Rx1, Rx4 or the second and third active regions Rx2, Rx3 by a respective STI 330. For example, while a STI 330 physically spaces a respective CBP 334 from the associated first and fourth active regions Rx1, Rx4 or the second and third active regions Rx2, Rx3, the respective CBP 334 may be in contact with the BP region 326 which extends below the STI 330 and to the associated first and fourth active regions Rx1, Rx4 or the second and third active regions Rx2, Rx3 of the first pass gate transistor PG1 and second pull-up transistor PU2 or the second pass gate transistor PG2 and first pull-up transistor PU1, respectively, of each bitcell 310A, 310B, 310C and 310D. As shown in FIGS. 18 and 19, the bitcells 310A, 310B, 310C and 310D also include the BP regions 326 below the STIs 330 and the CBPs 334 thereof. Each bitcell 310A, 310B, 310C and 310D thereby includes the BP regions 326 below the first, second, third and fourth active regions Rx1, Rx2, Rx3 and Rx4 and the STIs 330 and the CBPs 334. In this way, the size, shape, layout, location, etc. of the BP regions 326 may be formed to correspond to that of the first, second, third and fourth active regions Rx1, Rx2, Rx3 and Rx4 and the STIs 330 and the CBPs 334. The CBPs 334 of each bitcell 310A, 310B, 310C and 310D may thereby provide contacts to the BP regions 326 associated with the first pass gate transistor PG1 and second pull-up transistor PU2 or the second pass gate transistor PG2 and first pull-up transistor PU1, respectively, of the respective bitcell 310A, 310B, 310C and 310D.

In this way, during a read operation of one or more of the bitcells 310A, 310B, 310C and 310D, a grounding voltage or a lower voltage can be dynamically applied to at least one of the CBPs 334, and thereby the associated BP region(s) 326, to dynamically negatively bias at least one of the first and second pass gate transistors PG1, PG2 and the first and second pull-up transistors PU1, PU2 through the BOX layer 327. The electrical potential applied to at least one of the CBPs 334 may thereby pass or be transferred to at least one of the first and second pass gate transistors PG1, PG2 and the first and second pull-up transistors PU1, PU2 through the associated at least one BP region 326 and BOX layer 327 to effect operation of at least one of the first and second pass gate transistors PG1, PG2 and the first and second pull-up transistors PU1, PU2. Stated differently, the potential of at least one of the CBPs 334 can bias or effect at least one of the first and second pass gate transistors PG1, PG2 and the first and second pull-up transistors PU1, PU2 through or via the associated at least one BP region 326 and BOX layer 327 to effect operation of at least one of the first and second pass gate transistors PG1, PG2 and the first and second pull-up transistors PU1, PU2.

The negative bias to the first and second pass gate transistors PG1, PG2 and the first and second pull-up transistors PU1, PU2 may form a stronger pFET and weaker nFET to, thereby, improve the readability SNM and beta cell ratio of the bitcell(s). Conversely, during a write operation of one or more of the bitcells 310A, 310B, 310C and 310D, a positive voltage can be dynamically applied to the CBPs 334, and thereby the associated BP regions 326, to dynamically positively bias the first and second pass gate transistors PG1, PG2 and the first and second pull-up transistors PU1, PU2 through the BOX layer 327. The positive bias to the first and second pass gate transistors PG1, PG2 and the first and second pull-up transistors PU1, PU2 may form a stronger nFET and a weaker pFET to, thereby, improve the writeability SNM, gamma ratio and/or write margin of the bitcell(s). The negative and positive biases applied to the first and second pass gate transistors PG1, PG2 and the first and second pull-up transistors PU1, PU2 of at least one of the bitcells 310A, 310B, 310C and 310D via the corresponding CBPs 334 may thereby improve the Vmin and yield of the bitcells 310A, 310B, 310C and 310D.

FIGS. 20-23 illustrate an array 400 of 6T SRAM bitcells 410A, 410B, 410C and 410D formed on a semiconductor substrate 420 according to the present disclosure. The bitcells 410A, 410B, 410C and 410D of FIGS. 20-23 are substantially similar to the array 100 of 6T SRAM bitcells 110A, 110B, 110C and 110D described above with respect to FIGS. 3-15, the array 200 of 6T SRAM bitcells 210A, 210B, 210C and 210D described above with respect to FIGS. 16 and 17, and the array 300 of 6T SRAM bitcells 310A, 310B, 310C and 310D described above with respect to FIGS. 18 and 19, and therefore like reference numerals preceded with "4" are used to indicate like aspects, functions and the like, and the description above directed to aspects, functions and the like thereof (and the alternative embodiments thereof) equally applies to bitcells 410A, 410B, 410C and 410D. As shown in FIGS. 20-23, bitcells 410A, 410B, 410C and 410D differ from bitcells 110A, 110B, 110C and 110D, bitcells 210A, 210B, 210C and 210D and bitcells 310A, 310B, 310C and 310D in the layout or configuration of the DTIs 428 and CBPs 434.

Figure 20:
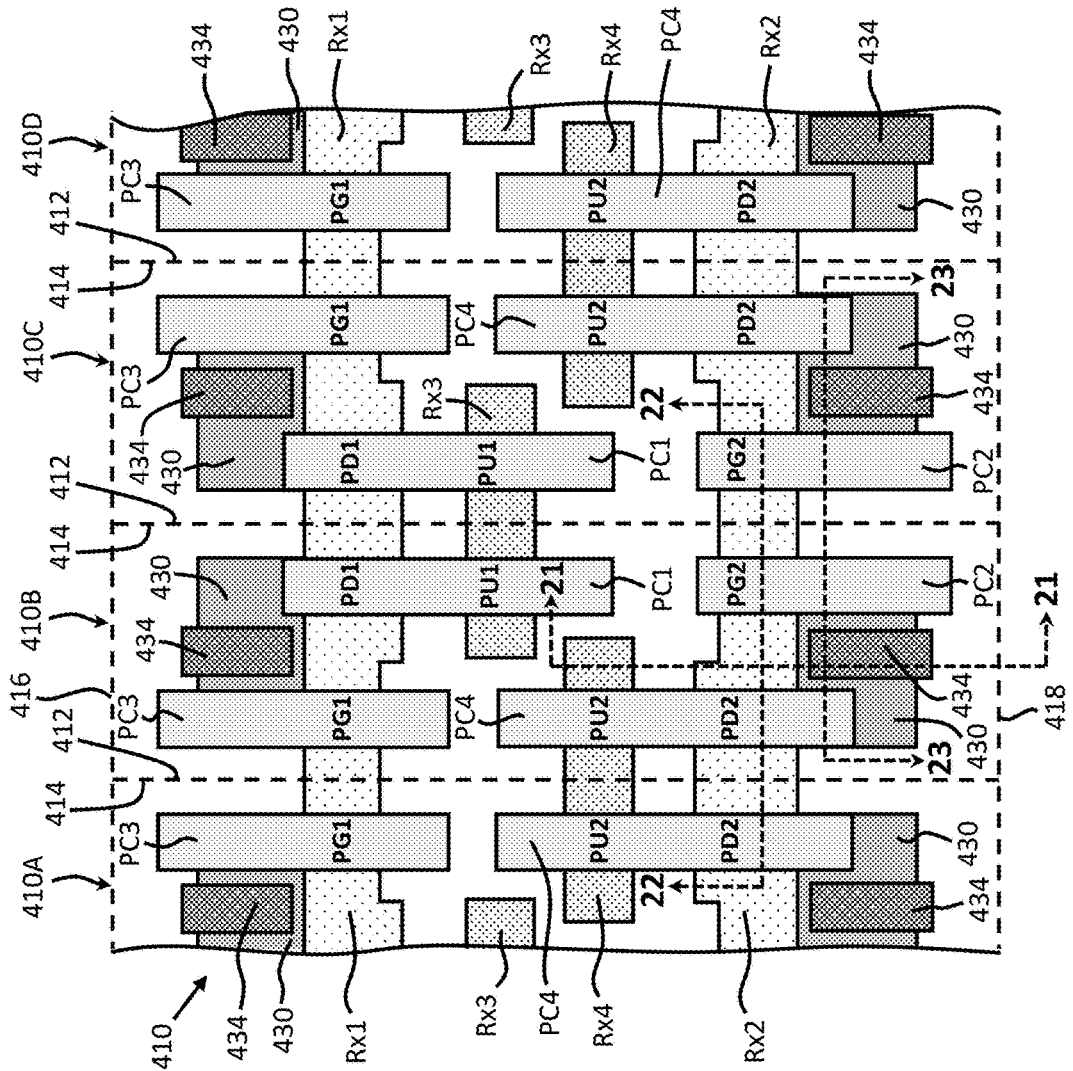
FIG. 20 illustrates an exemplary array of exemplary 6T SRAM bitcells according to the present disclosure.

As shown in FIGS. 20-23, bitcells 410A, 410B, 410C and 410D are configured to dynamically bias the first and second pull-down PD1, PD2 transistors and the first and second pass gate PG1, PG2 transistors thereof via the associated DTIs 428 and CBPs 434 through the BOX layer 427. For example, in the illustrated embodiment the STIs 430, 430 of each bitcell 410A, 410B, 410C and 410D are associated with the first and second pull-down transistors PD1, PD2 and the first and second pass gate transistors PG1, PG2. As shown in FIG. 20, each STI 430 extends laterally from the outer edge of the first and fourth PC constructs PC1, PC4 (forming the first and second pull-down transistors PD1, PD2) to the inner edge of the respective third and second PC constructs PC3, PC2 (forming the first and second pass gate transistors PG1, PG2) along the width direction of each bitcell 410A, 410B, 410C and 410D. In this way, each bitcell 410A, 410B, 410C and 410D includes two STI 430 regions including a first STI 430 region associated with the first and second pull-down transistors PD1, PD2 and a second STI 430 region associated with the first and second pass gate transistors PG1, PG2, as shown in FIG. 20. The first pull-down transistor PD1 and the first pass gate transistor PG1 of each bitcell 410A, 410B, 410C and 410D may share the first STI 430 region thereof, which may be associated and/or abut the shared first active region Rx1, as shown in FIG. 20. As also shown in FIG. 20, the second pull-down transistor PD2 and the second pass gate transistor PG2 of each bitcell 410A, 410B, 410C and 410D may share the second STI 430 region thereof, which may be associated and/or abut the shared second active region Rx2. As noted above, each STI 430 may be formed over an associated BP region 426.

Figure 21:
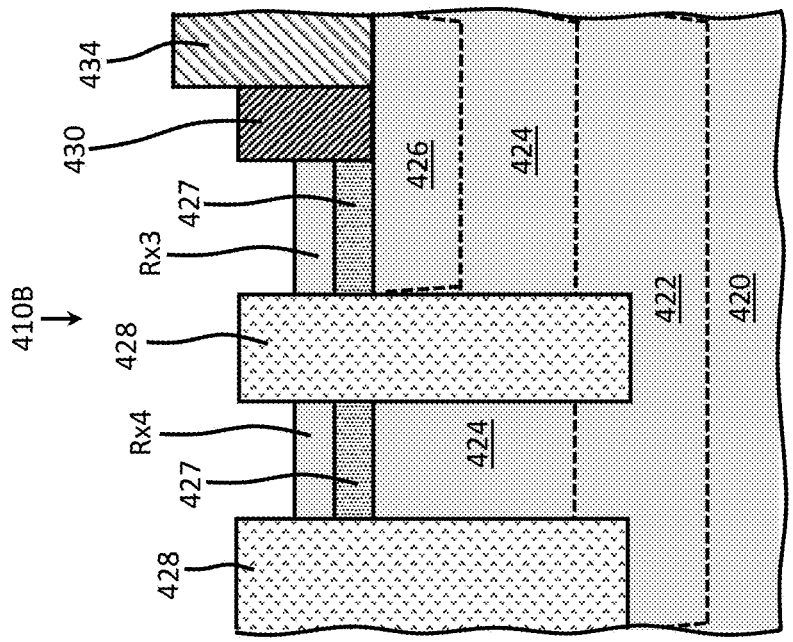
FIG. 21 illustrates a cross-sectional view of a portion of the bitcell array of FIG. 20.

As shown in FIGS. 20 and 21, each STI 430 may extend from the outer edge of first or second active regions Rx1, Rx2 along the length direction away from the interior of the respective bitcell 410A, 410B, 410C and 410D. For example, the each STI 430 may extend from the outer edge of the first or second active regions Rx1, Rx2 along the length direction away from the other of the first or second active regions Rx1, Rx2. In some other embodiments, each STI 430 may be spaced from an active region. Each bitcell 410A, 410B, 410C and 410D may thereby include a first STI 430 extending from the outer edge of the first active region Rx1 along the length direction away from the interior of the respective bitcell 410A, 410B, 410C and 410D (e.g., away from the second active region Rx2 along the length direction), and a second STI 430 extending from the outer edge of the second active region Rx2 along the length direction away from the interior of the respective bitcell 410A, 410B, 410C and 410D (e.g., away from the first active region Rx2 along the length direction), as shown in FIG. 20. As also shown in FIG. 20, the each STI 430 may extend from the outer edge of first or second active regions Rx1, Rx2 along the length direction away from the interior of the respective bitcell 410A, 410B, 410C and 410D and past the outer edge of the respective first or fourth PC construct PC1, PC4 forming the respective first or second pull-down transistor PD1, PD2. In some embodiments, each STI 430 may extend from the outer edge of first or second active regions Rx1, Rx2 along the length direction away from the interior of the respective bitcell 410A, 410B, 410C and 410D, past the outer edge of the respective first or fourth PC construct PC1, PC4, and terminate before the outer edge of the respective third or second PC construct PC3, PC2 forming the respective first or second pass gate transistor PG1, PG2. In this way, the outer edge of each STI 430 along the length direction may be positioned between the outer edges of the respective first and third PC construct PC1, PC3 or fourth and second PC construct PC4, PC2.

As shown in FIG. 20, the portion of each STI 430 proximate to the first or second active region Rx1, Rx2 may extend along the width direction between the respective first and third PC constructs PC1, PC3 or the fourth and second PC constructs PC4, PC2. As also shown in FIG. 20, the portion of each STI 430 positioned at or past the longitudinal end of the first or fourth PC construct PC1, PC4 along length direction may extend along the width direction from the inner lateral edge of the third or second PC construct PC2, PC3 to the outer lateral edge of the respective first or fourth PC construct PC1, PC4. In this way, the side edges (along the width direction) of the portion of each STI 430 positioned at or past the longitudinal end of the first or fourth PC construct PC1, PC4 along the length direction may be aligned with the inner lateral side edge of the third or second PC construct PC2, PC3 and the outer lateral side edge of the respective first or second active region Rx1, Rx2. In this way, each STI 430 may extend along the outer longitudinal end of the first or fourth active region Rx1, Rx along the width direction to the outer lateral edge thereof.

Each STI 430 of each bitcell 410A, 410B, 410C and 410D may include an associated CBP 434, as shown in FIG. 20. Each STI 430 may abut and extend partially about a respective CBP 434 (along the length and/or width directions). As shown in FIG. 20, each CBP 434 may positioned in a medial portion of the respective STI 430 along the width direction and may be offset or extend past the outer longitudinal edge of the respective STI 430 along the length direction. As shown in FIGS. 20 and 21, each CBP 434 may be spaced from the respective first or second active region Rx1, Rx2 along the length direction away from the interior of the respective bitcell 410A, 410B, 410C and 410D. In some embodiments, each CBP 434 may extend past the outer longitudinal edge of the respective STI 430 along the length direction by about the same distance as the CBP 434 is spaced from the respective first or second active region Rx1, Rx2 along the length direction. Along the width direction, each CBP 434 may be spaced between the respective first and third PC constructs PC1, PC3 or second and fourth PC constructs PC2, PC4 (e.g., potentially evenly spaced) of each bitcell 410A, 410B, 410C and 410D, as shown in FIGS. 20 and 23.

Figure 22:
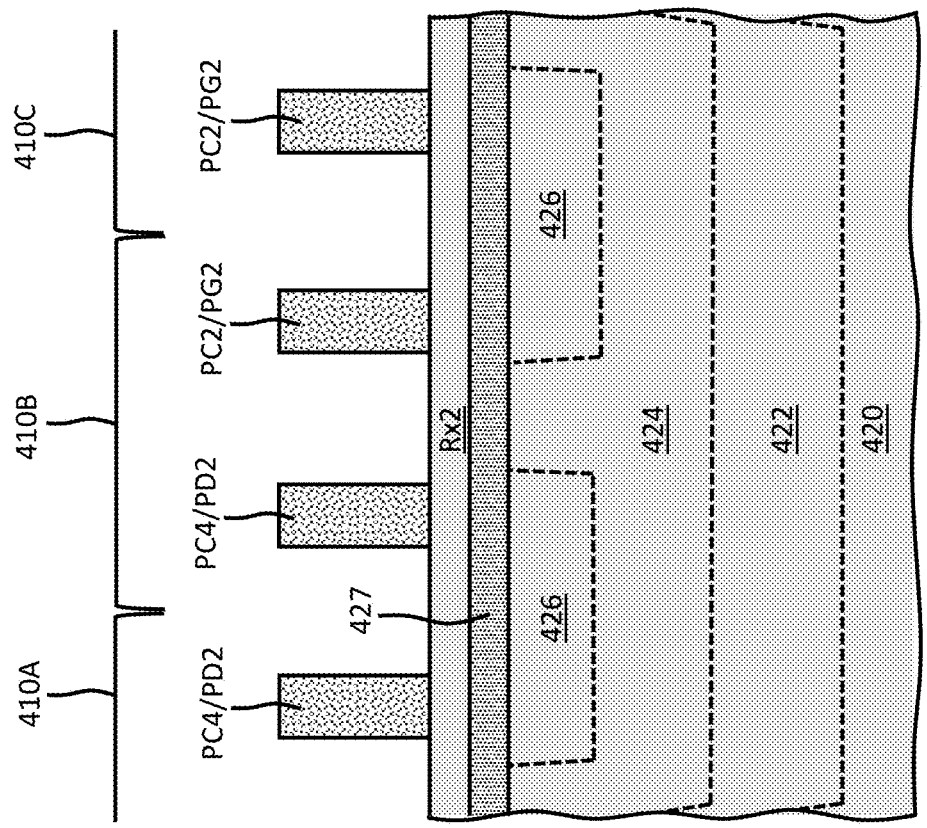
FIG. 22 illustrates a cross-sectional view of another portion of the bitcell array of FIG. 20.
Figure 23:
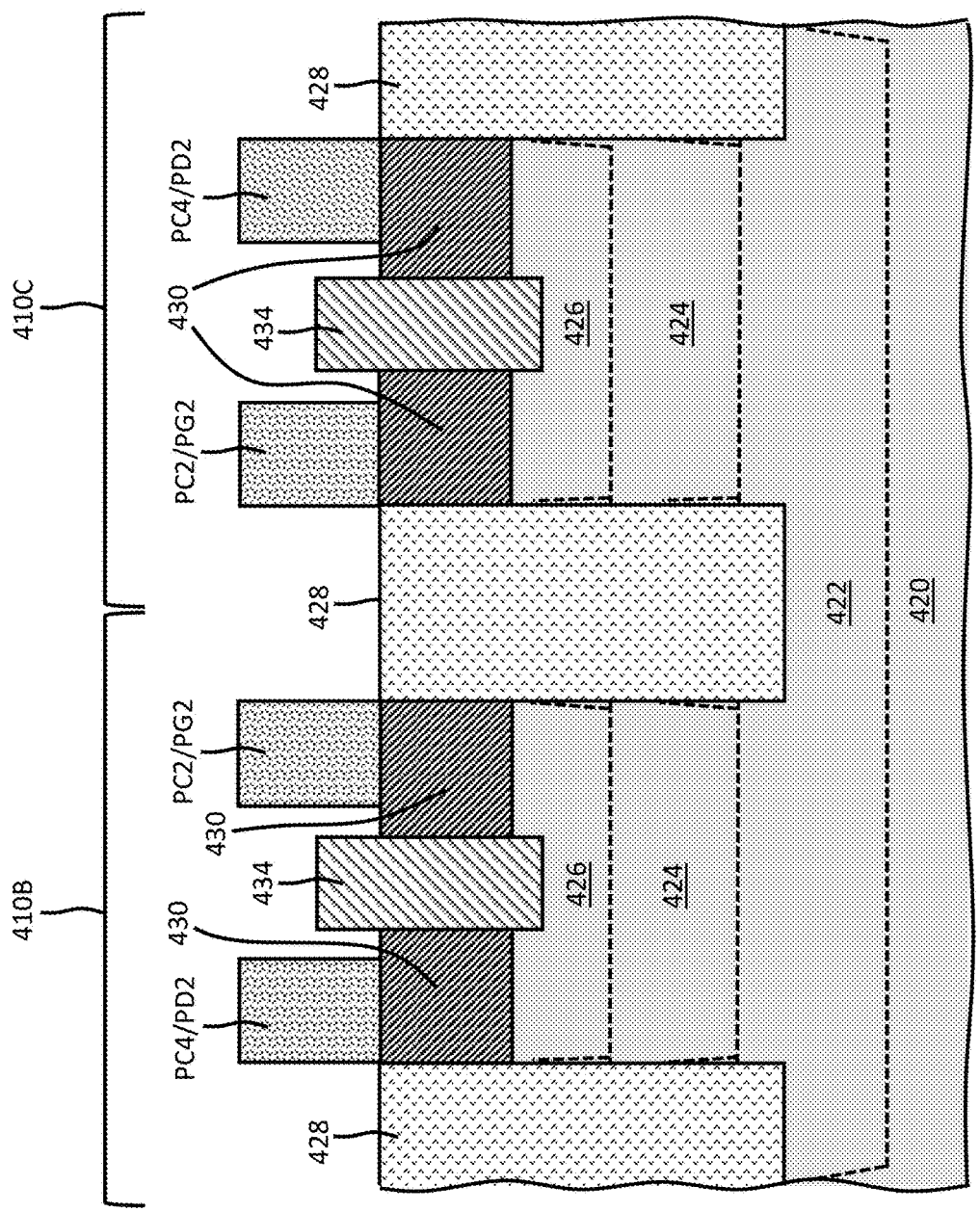
FIG. 23 illustrates a cross-sectional view of another portion of the bitcell array of FIG. 20.

As shown in FIG. 23, the CBPs 434 of each bitcell 410A, 410B, 410C and 410D may also be spaced and isolated from the respective first and third PC constructs PC1, PC3 or the second and fourth PC constructs PC2, PC4 along the width direction. As shown in FIG. 21, the CBPs 434 of each bitcell 410A, 410B, 410C and 410D may be spaced and isolated from the respective first active region Rx1 or the second active region Rx2 along the length direction by the respective STI 430. While a STI 430 physically spaces a respective CBP 434 from the associated first active region Rx1 or the second active region Rx2 along the length direction and the associated first and third PC constructs PC1, PC3 or the second and fourth PC constructs PC2, PC4 along the width direction, the respective CBP 434 may be in contact with the BP region 426 which extends below the STIs 430 and to the associated first active region Rx1 forming the first pass gate transistor PG1 and first pull-down transistor PD1 or to the associated second active region Rx2 forming the second pass gate transistor PG2 and second pull-down transistor PD2, respectively, of each bitcell 410A, 410B, 410C and 410D. As shown in FIGS. 21-23, the bitcells 410A, 410B, 410C and 410D also include the BP regions 426 below the STIs 430 and the CBPs 434 thereof. Each bitcell 410A, 410B, 410C and 410D thereby includes the BP regions 426 below the first, second, third and fourth active regions Rx1, Rx2, Rx3 and Rx4 and the STIs 430 and the CBPs 434. In this way, the size, shape, layout, location, etc. of the BP regions 426 may be formed to correspond to that of the first, second, third and fourth active regions Rx1, Rx2, Rx3 and Rx4 and the STIs 430 and the CBPs 434. The CBPs 434 of each bitcell 410A, 410B, 410C and 410D may thereby provide contacts to the BP regions 426 associated with the first pass gate transistor PG1 and the first pull-down transistor PD2 (formed by the first active region Rx1 and the first and third PC constructs PC1, PC3) or the second pass gate transistor PG2 and the second pull-down transistor PD2 (formed by the second active region Rx2 and the second and fourth PC constructs PC2, PC4) of the respective bitcells 410A, 410B, 410C and 410D.

In this way, during a read operation of one or more of the bitcells 410A, 410B, 410C and 410D, a grounding voltage or a lower voltage can be dynamically applied to at least one of the CBPs 434, and thereby the associated at least one BP region 426, to dynamically negatively bias at least one of the first pull-down and first pass gate transistors PD1, PG1 and the second pull-down and second pass gate transistors PD2, PG2 through the BOX layer 427 of any of the bitcells 410A, 410B, 410C and 410D. The electrical potential applied to at least one of the CBPs 434 may thereby pass or be transferred to at least one of the first pull-down and first pass gate transistors PD1, PG1 and the second pull-down and second pass gate transistors PD2, PG2 through the associated at least one BP region 426 and BOX layer 427 to effect operation of the at least one of the first pull-down and first pass gate transistors PD1, PG1 and the second pull-down and second pass gate transistors PD2, PG2. Stated differently, the potential of at least one of the CBPs 434 can bias or effect at least one of the first pull-down and first pass gate transistors PD1, PG1 and the second pull-down and second pass gate transistors PD2, PG2 through or via the associated at least one BP region 426 and BOX layer 427 to effect operation of the at least one of the first pull-down and first pass gate transistors PD1, PG1 and the second pull-down and second pass gate transistors PD2, PG2

In some embodiments, only one of the CBPs 434 and an associated BP regions 426 may be utilized to bias one of first pull-down and first pass gate transistors PD1, PG1 or the second pull-down and second pass gate transistors PD2, PG2 of a bitcell. In other embodiments, both of the CBPs 434 and associated BP regions 426 may be utilized to bias both the first pull-down and first pass gate transistors PD1, PG1 and the second pull-down and second pass gate transistors PD2, PG2 of a bitcell. The negative bias to the first pull-down and first pass gate transistors PD1, PG1 and/or the second pull-down and second pass gate transistors PD2, PG2 may form a weaker nFET to, thereby, improve the readability, SNM and beta cell ratio of the bitcell(s). Conversely, during a write operation of one or more of the bitcells 410A, 410B, 410C and 410D, a positive voltage can be dynamically applied to at least one CBP 434, and thereby at least one associated BP region 426, to dynamically positively bias at least one of the first pull-down and first pass gate transistors PD1, PG1 and the second pull-down and second pass gate transistors PD2, PG2 through the BOX layer 427. The positive bias to at least one of the first pull-down and first pass gate transistors PD1, PG1 and the second pull-down and second pass gate transistors PD2, PG2 may form a stronger nFET to, thereby, improve the writeability SNM, gamma ratio and/or write margin of the bitcell(s). In another embodiment, no bias may be applied to at least one of the first pull-down and first pass gate transistors PD1, PG1 and the second pull-down and second pass gate transistors PD2, PG2 during a write operation to, thereby, improve the write failure of a bitcell. The negative bias, positive bias, or lack of bias applied to at least one of the first pull-down and first pass gate transistors PD1, PG1 and the second pull-down and second pass gate transistors PD2, PG2 of at least one of the bitcells 410A, 410B, 410C and 410D via the corresponding CBP 434 and BP region 426 may thereby improve the Vmin and yield of the bitcells 410A, 410B, 410C and 410D.

FIGS. 24-28 illustrate an array 500 of 6T SRAM bitcells 510A, 510B, 510C and 510D formed on a semiconductor substrate 520 according to the present disclosure. The bitcells 510A, 510B, 510C and 510D of FIGS. 24-28 are substantially similar to the array 100 of 6T SRAM bitcells 110A, 110B, 110C and 110D described above with respect to FIGS. 3-15, the array 200 of 6T SRAM bitcells 210A, 210B, 210C and 210D described above with respect to FIGS. 16 and 17, the array 300 of 6T SRAM bitcells 310A, 310B, 310C and 310D described above with respect to FIGS. 18 and 19, and the array 400 of 6T SRAM bitcells 410A, 410B, 410C and 410D of FIGS. 20-23, and therefore like reference numerals preceded with "5" are used to indicate like aspects, functions and the like, and the description above directed to aspects, functions and the like thereof (and the alternative embodiments thereof) equally applies to bitcells 510A, 510B, 510C and 510D. As shown in FIGS. 24-27, bitcells 510A, 510B, 510C and 510D differ from bitcells 110A, 110B, 110C and 110D, bitcells 210A, 210B, 210C and 210D, bitcells 310A, 310B, 310C and 310D and bitcells 410A, 410B, 410C and 410D in the layout or configuration of the DTIs 528 and CBPs 534.

Figure 24:
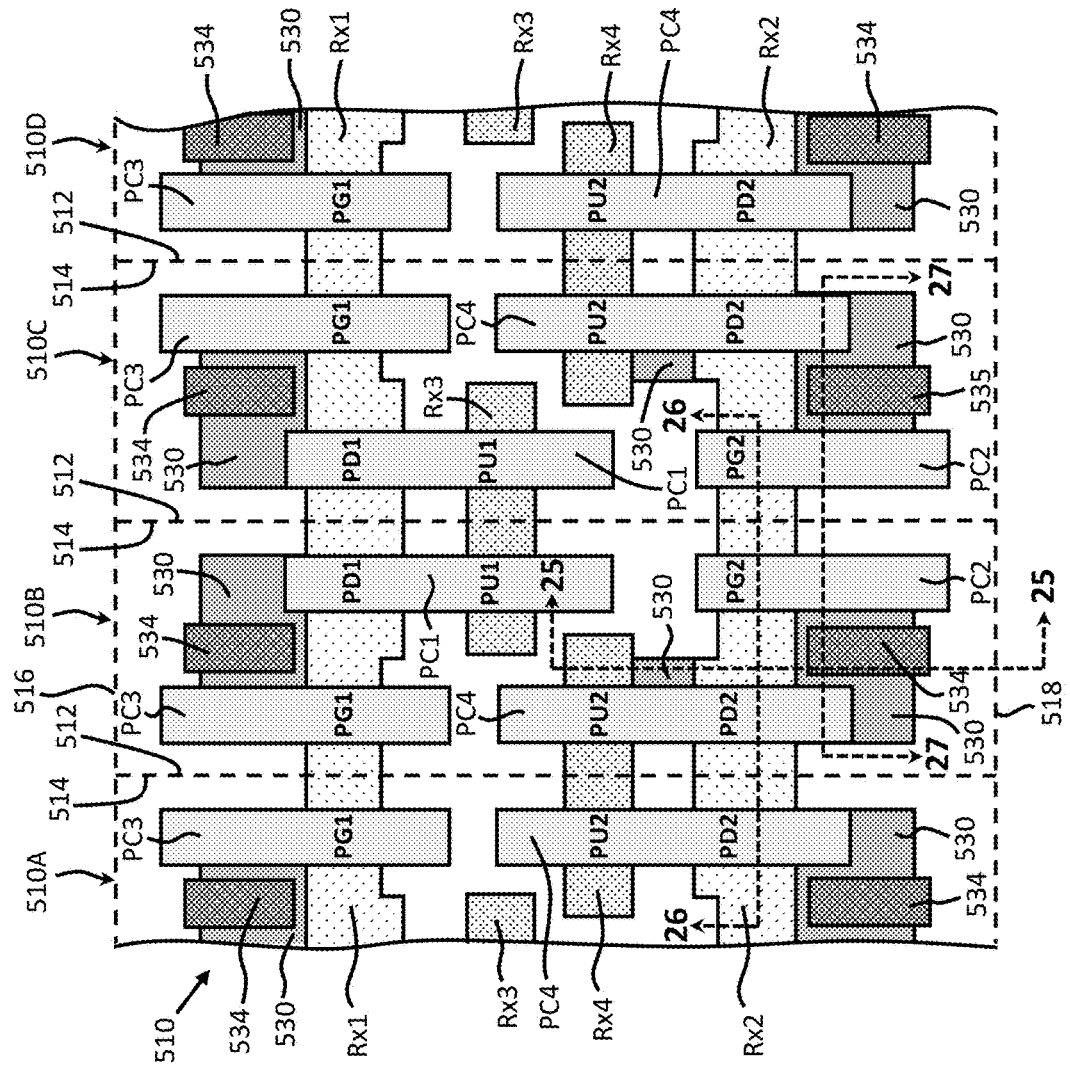
FIG. 24 illustrates an exemplary array of exemplary 6T SRAM bitcells according to the present disclosure.

As shown in FIGS. 24-27, bitcells 510A, 510B, 510C and 510D are configured to dynamically bias the first and second pull-down PD1, PD2 transistors, the first and second pass gate PG1, PG2 transistors, and the first and second pull-up transistors PU1, PU2 thereof via the associated STIs 530 and CBPs 534 through the BOX layer 527. For example, in the illustrated embodiment the STIs 530 of each bitcell 510A, 510B, 510C and 510D are associated with the first and second pull-down transistors PD1, PD2, the first and second pass gate transistors PG1, PG2, and the first and second pull-up transistors PU1, PU2. As shown in FIG. 24, an STI 530 extends laterally from the outer edge of the first and fourth PC constructs PC1, PC4 (forming the first and second pull-down transistors PD1, PD2) to the inner edge of the respective third and second PC constructs PC3, PC2 (forming the first and second pass gate transistors PG1, PG2) along the width direction of each bitcell 510A, 510B, 510C and 510D on the outer longitudinal sides of the respective first and second active regions Rx1, Rx2 along the length direction. As also shown in FIG. 24, each bitcell 510A, 510B, 510C and 510D further includes an STI 530 extending laterally along the width direction from the inner edge of each of the first and fourth active regions Rx1, Rx4 toward the interior of the bitcells and between the respective first and third active regions Rx1, Rx3 or the second and fourth active regions Rx2, Rx4.

In this way, each bitcell 510A, 510B, 510C and 510D includes four STI 530 regions that include a first STI 530 region associated with the first and second pull-down transistors PD1, PD2, a second STI 530 region associated with the first and second pass gate transistors PG1, PG2, a third STI 530 region associated with the first pull-down transistor PD1 and the first pull-up transistor PU1, and a fourth STI 530 region associated with the first pass gate transistor PG1 and the first pull-up transistor PU1. The first pull-down transistor PD1 and the first pass gate transistor PG1 of each bitcell 510A, 510B, 510C and 510D may share the first STI 530 region thereof, which may be associated and/or abut the shared first active region Rx1, as shown in FIG. 24. As also shown in FIG. 24, the second pull-down transistor PD2 and the second pass gate transistor PG2 of each bitcell 510A, 510B, 510C and 510D may share the second STI 530 region thereof, which may be associated and/or abut the shared second active region Rx2. The first pull-down transistor PD1 and the first pull-up transistor PU1 of each bitcell 510A, 510B, 510C and 510D may share the third STI 530 region thereof, which may be associated and/or abut the first and third active regions Rx1, Rx3, as shown in FIG. 24. As further shown in FIG. 24, the second pull-down transistor PD2 and the second pull-up transistor PU2 of each bitcell 510A, 510B, 510C and 510D may share the fourth STI 530 region thereof, which may be associated and/or abut the second and fourth active regions Rx2, Rx4. As noted above, each STI 530 may be formed over an associated BP region 526 of the same shape, layout, location, etc.

As shown in FIG. 24, the bitcells 510A, 510B, 510C and 510D each include STI 530 regions extending from the outer edge of first or second active regions Rx1, Rx2 along the length direction away from the interior of the respective bitcell 510A, 510B, 510C and 510D. For example, STIs 530 may extend from the outer edge of the first or second active regions Rx1, Rx2 along the length direction away from the other of the first or second active regions Rx1, Rx2. In some other embodiments, these STIs 530 may be spaced from an active region. Each bitcell 510A, 510B, 510C and 510D may thereby include a first STI 530 extending from the outer edge of the first active region Rx1 along the length direction away from the interior of the respective bitcell 510A, 510B, 510C and 510D (e.g., away from the second active region Rx2 along the length direction), and a second STI 530 extending from the outer edge of the second active region Rx2 along the length direction away from the interior of the respective bitcell 510A, 510B, 510C and 510D (e.g., away from the first active region Rx2 along the length direction), as shown in FIG. 24. As also shown in FIG. 24, such STIs 530 may extend from the outer edge of first or second active regions Rx1, Rx2 along the length direction away from the interior of the respective bitcell 510A, 510B, 510C and 510D and past the outer edge of the respective first or fourth PC construct PC1, PC4 forming the respective first or second pull-down transistor PD1, PD2. In some embodiments, these STIs 530 may extend from the outer edge of first or second active regions Rx1, Rx2 along the length direction away from the interior of the respective bitcell 510A, 510B, 510C and 510D, past the outer edge of the respective first or fourth PC construct PC1, PC4, and terminate before the outer edge of the respective third or second PC construct PC3, PC2 forming the respective first or second pass gate transistor PG1, PG2. In this way, the outer edge of such STI 530 regions along the length direction may be positioned between the outer edges of the respective first and third PC construct PC1, PC3 or fourth and second PC construct PC4, PC2.

As shown in FIG. 20, the portion of each STI 530 proximate to the first or second active region Rx1, Rx2 may extend along the width direction between the respective first and third PC constructs PC1, PC3 or the fourth and second PC constructs PC4, PC2. As also shown in FIG. 20, the portion of each STI 530 positioned at or past the longitudinal end of the first or fourth PC construct PC1, PC4 along length direction may extend along the width direction from the inner lateral edge of the third or second PC construct PC2, PC3 to the outer lateral edge of the respective first or fourth PC construct PC1, PC4. In this way, the side edges (along the width direction) of the portion of each STI 530 positioned at or past the longitudinal end of the first or fourth PC construct PC1, PC4 along the length direction may be aligned with the inner lateral side edge of the third or second PC construct PC2, PC3 and the outer lateral side edge of the respective first or second active region Rx1, Rx2. In this way, each STI 530 may extend along the outer longitudinal end of the first or fourth active region Rx1, Rx4 along the width direction to the outer lateral edge thereof.

As shown in FIG. 24, in addition to the STI 530 regions positioned at or past the outer longitudinal ends of the first or second active region Rx1, Rx2 along the length direction of each bitcell 510A, 510B, 510C and 510D, the bitcells may include additional STI 530 regions extending laterally along the width direction from the inner side edge of the first or fourth PC constructs PC1, PC4 and longitudinally along the length direction between the respective first and third active regions Rx1, Rx3 or the fourth and second active regions Rx4, Rx2. In some embodiments, these STI 530 regions may extend laterally along the width direction from the inner side edge of the first or fourth PC constructs PC1, PC4 to the edge of the narrow portion of the respective associated first or second active region Rx1, Rx2, as shown in FIG. 24. In some embodiments, the third or fourth active regions Rx3, Rx4 may extend further along the width direction toward the interior of a respective bitcell 510A, 510B, 510C and 510D than the associated STI 530. As noted above, each STI 530 may be formed over an associated BP region 526 of the same shape, layout, location, etc.

Figure 25:
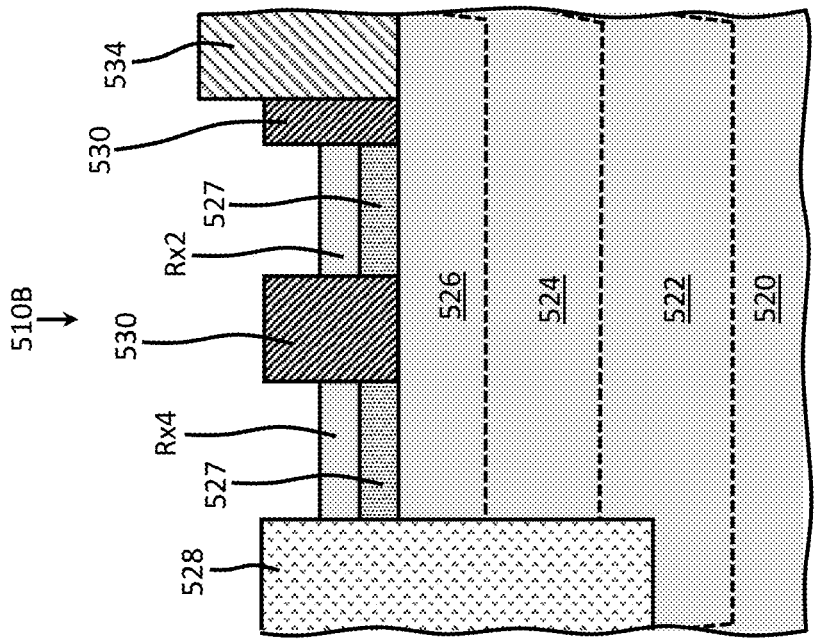
FIG. 25 illustrates a cross-sectional view of a portion of the bitcell array of FIG. 24.
Figure 27:
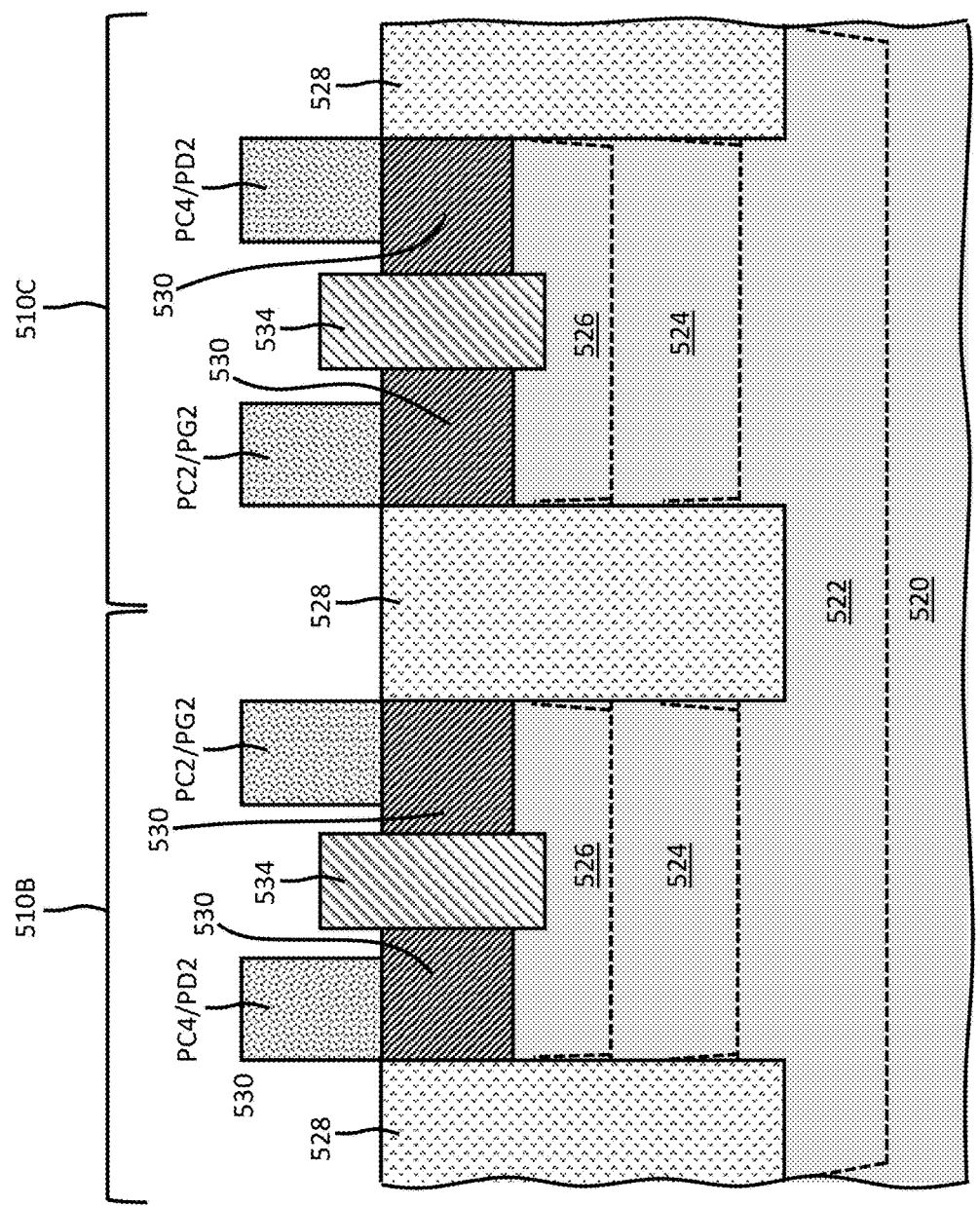
FIG. 27 illustrates a cross-sectional view of another portion of the bitcell array of FIG. 24.

Each bitcell 510A, 510B, 510C and 510D may include a CBP 534 associated with the STI 530 regions positioned at or past the outer longitudinal ends of the first or second active region Rx1, Rx2 along the length direction, as shown in FIGS. 24, 25 and 27. These STI 530 regions may abut and extend partially about a respective CBP 534 (along the length and/or width directions). As shown in FIG. 24, each CBP 534 may positioned in a medial portion of the respective STI 530 along the width direction and may be offset or extend past the outer longitudinal edge of the respective STI 530 along the length direction. As shown in FIGS. 24 and 25, each CBP 534 may be spaced from the respective first or second active region Rx1, Rx2 along the length direction away from the interior of the respective bitcell 510A, 510B, 510C and 510D. In some embodiments, each CBP 534 may extend past the outer longitudinal edge of the respective STI 530 along the length direction by about the same distance as the CBP 534 is spaced from the respective first or second active region Rx1, Rx2 along the length direction. Along the width direction, each CBP 534 may be spaced between the respective first and third PC constructs PC1, PC3 or second and fourth PC constructs PC2, PC4 (e.g., potentially evenly spaced) of each bitcell 510A, 510B, 510C and 510D, as shown in FIGS. 24 and 25.

As shown in FIG. 27, the CBPs 534 of each bitcell 510A, 510B, 510C and 510D may also be spaced and isolated from the respective first and third PC constructs PC1, PC3 or the second and fourth PC constructs PC2, PC4 along the width direction. As shown in FIG. 25, the CBPs 534 of each bitcell 510A, 510B, 510C and 510D may be spaced and isolated from the respective first active region Rx1 or the second active region Rx2 along the length direction by the respective STI 530. While a STI 530 physically spaces a respective CBP 534 from the associated first active region Rx1 or the second active region Rx2 along the length direction and the associated first and third PC constructs PC1, PC3 or the second and fourth PC constructs PC2, PC4 along the width direction, the respective CBP 534 may be in contact with the BP region 526 which extends below the STIs 530 and to the associated first active region Rx1 forming the first pass gate transistor PG1 and first pull-down transistor PD1 or to the associated second active region Rx2 forming the second pass gate transistor PG2 and second pull-down transistor PD2, respectively, of each bitcell 510A, 510B, 510C and 510D. As shown in FIG. 25, an STI 530 may extend longitudinally between the first and third active regions Rx1, Rx3 along the length direction as opposed to a DTI 528, and an STI 530 may extend longitudinally between the second and fourth active regions Rx2, Rx4 along the length direction as opposed to a DTI 528.

Figure 26:
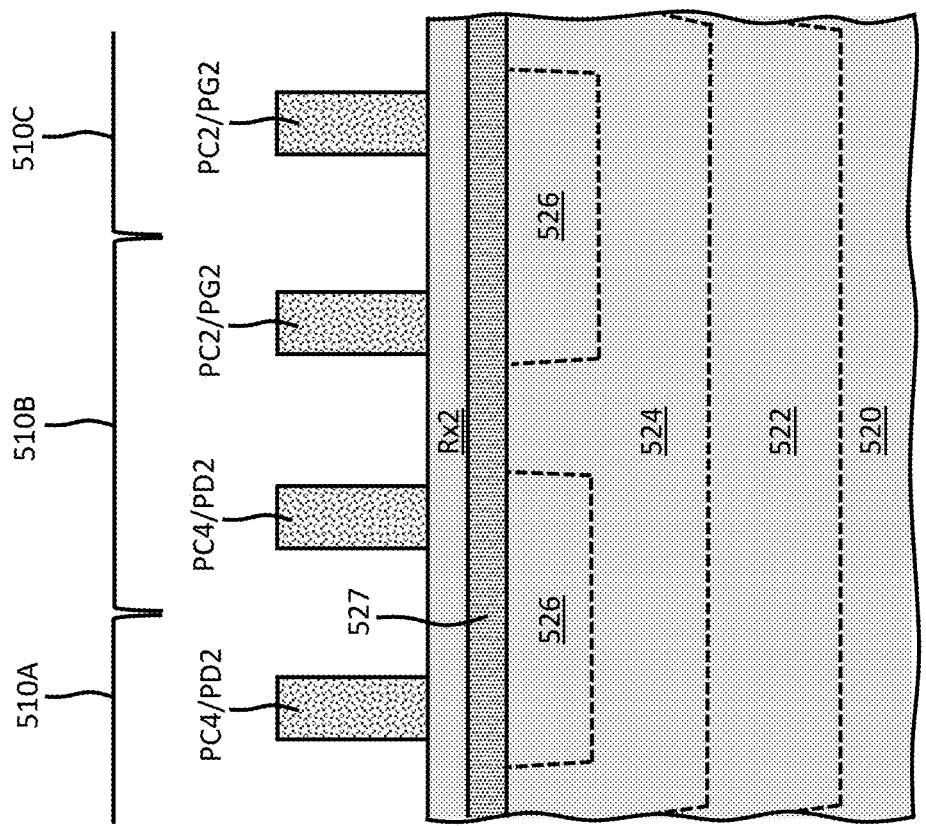
FIG. 26 illustrates a cross-sectional view of another portion of the bitcell array of FIG. 24.

As shown in FIGS. 25-27, the bitcells 510A, 510B, 510C and 510D however include the BP regions 526 below the STIs 530 and the CBPs 534 thereof. Each bitcell 510A, 510B, 510C and 510D thereby includes the BP regions 526 below the first, second, third and fourth active regions Rx1, Rx2, Rx3 and Rx4 and the STIs 530 and the CBPs 534. In this way, the size, shape, layout, location, etc. of the BP regions 526 may be formed to correspond to that of the first, second, third and fourth active regions Rx1, Rx2, Rx3 and Rx4 and the STIs 530 and the CBPs 534. As shown in FIG. 25, a BP region 526 may thereby extend beneath the CBP 534 and STI 530 proximate to the outer longitudinal side along the length direction of the second active region Rx2, the second active region Rx2, the STI 530 extending longitudinally between the second and fourth active regions Rx2, Rx4 along the length direction, and the fourth active region Rx4 of each bitcell 510A, 510B, 510C and 510D. Similarly, as shown in FIG. 24 a BP region 526 may thereby extend beneath the CBP 534 and STI 530 proximate to the outer longitudinal side along the length direction of the first active region Rx1, the first active region Rx1, the STI 530 extending longitudinally between the first and third active regions Rx1, Rx3 along the length direction, and the third active region Rx3 of each bitcell 510A, 510B, 510C and 510D. One CBP 534 of each bitcell 510A, 510B, 510C and 510D may thereby provide contact to the BP region 526 associated with the first pass gate transistor PG1 and the first pull-down transistor PD2 (formed by the first active region Rx1 and the first and third PC constructs PC1, PC3) and the first pull-up transistor PU1 (formed by the third active region Rx3 and the first PC construct PC1), and another CBP 534 of each bitcell 510A, 510B, 510C and 510D may thereby provide contact to the BP region 526 associated with or the second pass gate transistor PG2 and the second pull-down transistor PD2 (formed by the second active region Rx2 and the second and fourth PC constructs PC2, PC4) and the second pull-up transistor PU2 (formed by the fourth active region Rx4 and the fourth PC construct PC4).

In this way, during a read operation of one or more of the bitcells 510A, 510B, 510C and 510D, a grounding voltage or a lower voltage can be dynamically applied to at least one of the CBPs 534 thereof, and thereby the associated at least one BP region 526, to dynamically negatively bias at least one of the first pull-down transistor PD1, first pull-up transistor PU1 and first pass gate transistors PG1 or the second pull-down transistor PD2, second pull-up transistor PU2 and second pass gate transistors PG2 through the BOX layer 527. The electrical potential applied to at least one of the CBPs 534 may thereby pass or be transferred to at least one of the first pull-down transistor PD1, first pull-up transistor PU1 and first pass gate transistors PG1 or the second pull-down transistor PD2, second pull-up transistor PU2 and second pass gate transistors PG2 through the associated at least one BP region 526 and BOX layer 527 to effect operation of at least one of the first pull-down transistor PD1, first pull-up transistor PU1 and first pass gate transistors PG1 or the second pull-down transistor PD2, second pull-up transistor PU2 and second pass gate transistors PG2. Stated differently, the potential of at least one of the CBPs 534 can bias or effect at least one of the first pull-down transistor PD1, first pull-up transistor PU1 and first pass gate transistors PG1 or the second pull-down transistor PD2, second pull-up transistor PU2 and second pass gate transistors PG2 through or via the associated at least one BP region 526 and BOX layer 527 to effect operation of at least one of the first pull-down transistor PD1, first pull-up transistor PU1 and first pass gate transistors PG1 or the second pull-down transistor PD2, second pull-up transistor PU2 and second pass gate transistors PG2.

In some embodiments, only one of the CBPs 534 and an associated BP region 526 may be utilized to bias one of the first pull-down transistor PD1, first pull-up transistor PU1 and first pass gate transistors PG1 or the second pull-down transistor PD2, second pull-up transistor PU2 and second pass gate transistors PG2 of a bitcell. In other embodiments, both of the CBPs 534 (and thereby the associated BP regions 526) may be utilized to bias both the first pull-down transistor PD1, first pull-up transistor PU1 and first pass gate transistors PG1 and the second pull-down transistor PD2, second pull-up transistor PU2 and second pass gate transistors PG2 of a bitcell. The negative bias to the first pull-down transistor PD1, first pull-up transistor PU1 and first pass gate transistors PG1 and/or the second pull-down transistor PD2, second pull-up transistor PU2 and second pass gate transistors PG2 may form a weaker nFET to, thereby, improve the readability, SNM and beta cell ratio of the bitcell(s). Similarly, standby mode of one or more of the bitcells 510A, 510B, 510C and 510D, a grounding voltage or a lower voltage can be dynamically applied to at least one of the CBPs 534 thereof, and thereby the associated at least one BP region 526, to dynamically negatively bias at least one of the first pull-down transistor PD1, first pull-up transistor PU1 and first pass gate transistors PG1 or the second pull-down transistor PD2, second pull-up transistor PU2 and second pass gate transistors PG2 through the BOX layer 527 to improve data retention. Conversely, during a write operation of one or more of the bitcells 510A, 510B, 510C and 510D, a positive voltage can be dynamically applied to at least one CBP 534, and thereby at least one associated BP region 526, to dynamically positively bias first pull-down transistor PD1, first pull-up transistor PU1 and first pass gate transistors PG1 or the second pull-down transistor PD2, second pull-up transistor PU2 and second pass gate transistors PG2 through the BOX layer 527. The positive bias to at least one of the first pull-down transistor PD1, first pull-up transistor PU1 and first pass gate transistors PG1 or the second pull-down transistor PD2, second pull-up transistor PU2 and second pass gate transistors PG2 may form a stronger nFET to, thereby, improve the writeability, SNM, gamma ratio and/or write margin of the bitcell(s). The negative bias, positive bias (or lack of bias) applied to at least one of the first pull-down transistor PD1, first pull-up transistor PU1 and first pass gate transistors PG1 or the second pull-down transistor PD2, second pull-up transistor PU2 and second pass gate transistors PG2 of at least one of the bitcells 510A, 510B, 510C and 510D via the corresponding at least one CBP 534 and BP region 526 may thereby improve the Vmin and yield of the bitcells 510A, 510B, 510C and 510D.

Figure 28:
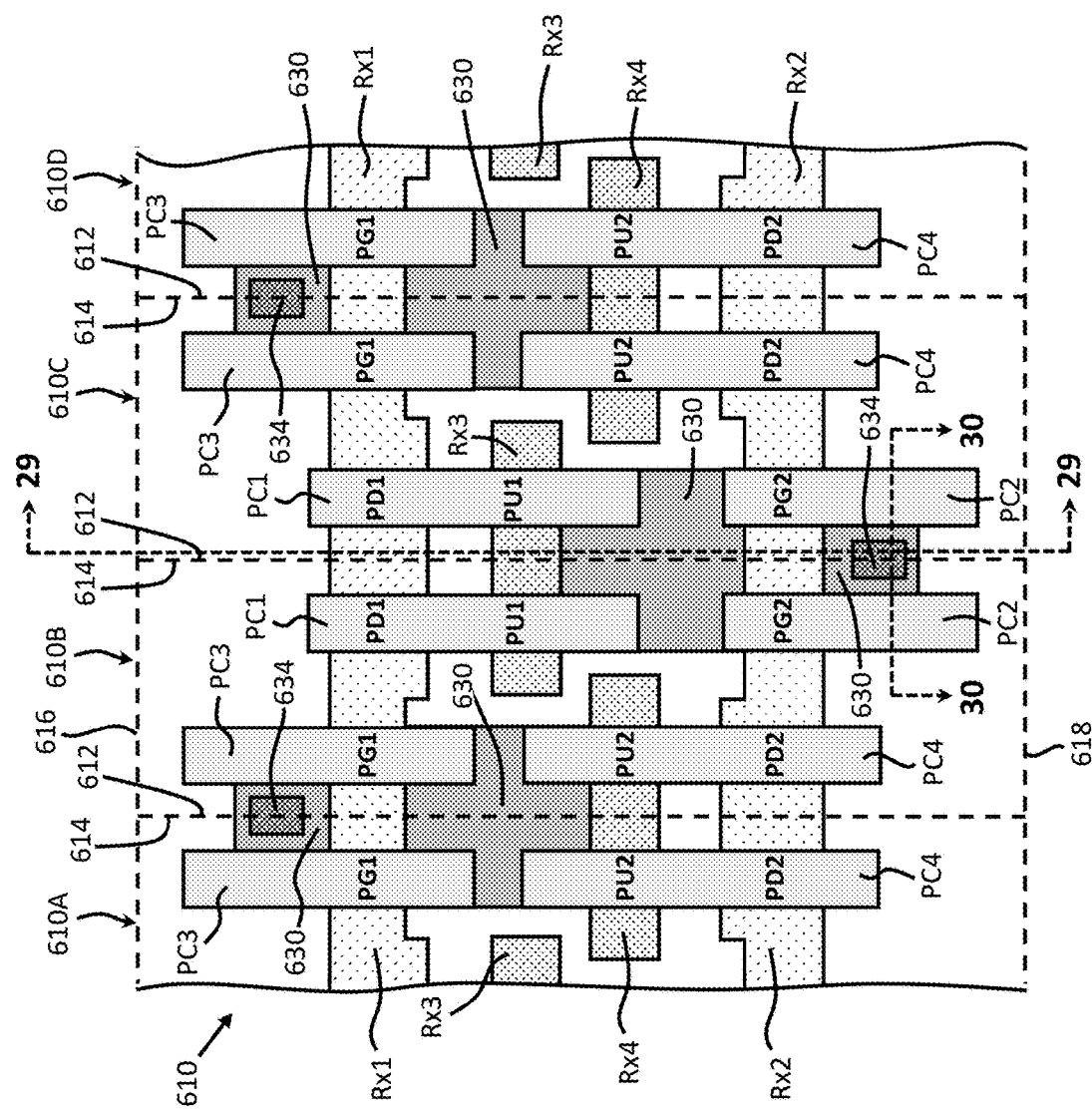
FIG. 28 illustrates an exemplary array of exemplary 6T SRAM bitcells according to the present disclosure.
Figure 29:
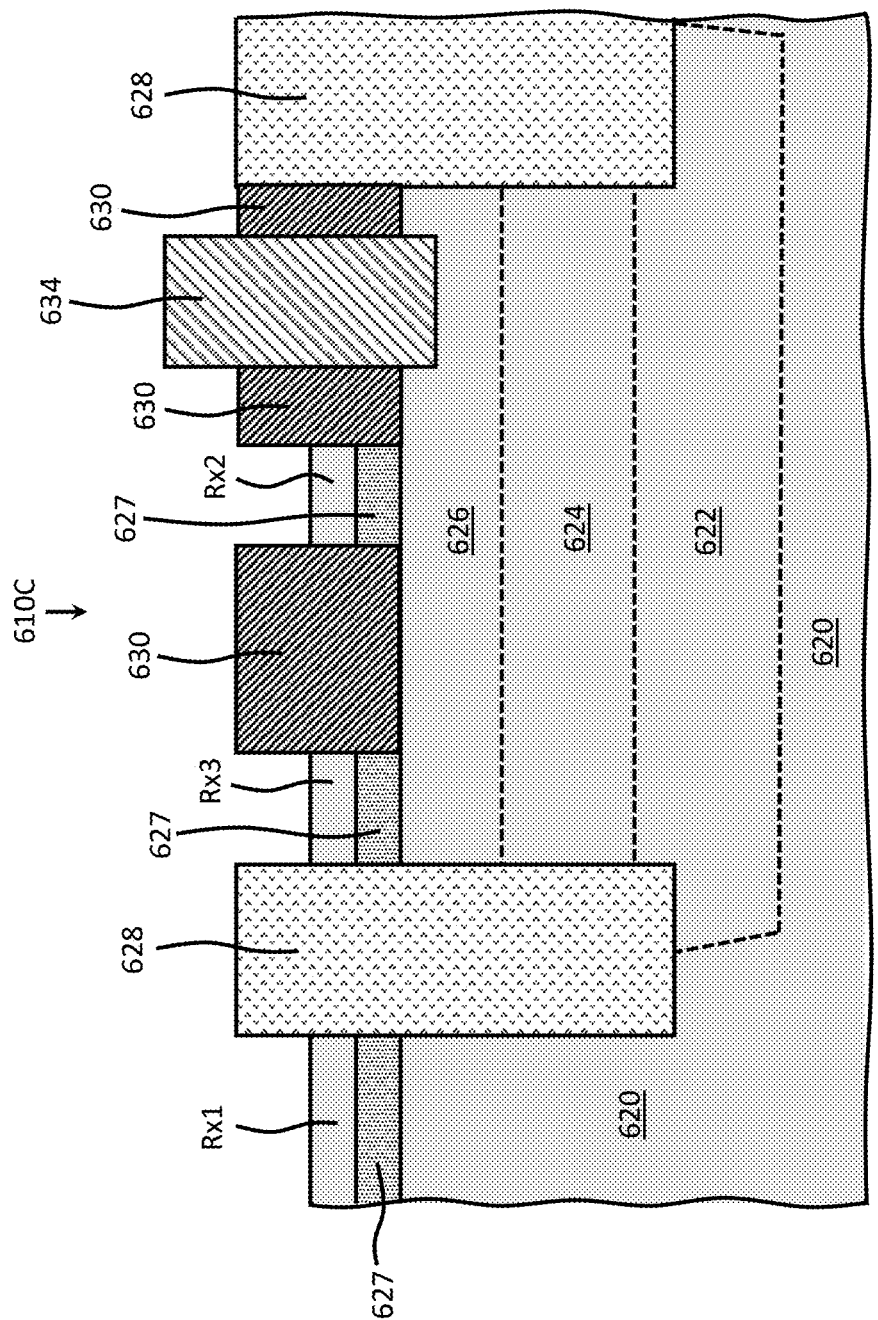
FIG. 29 illustrates a cross-sectional view of a portion of the bitcell array of FIG. 28.
Figure 30:
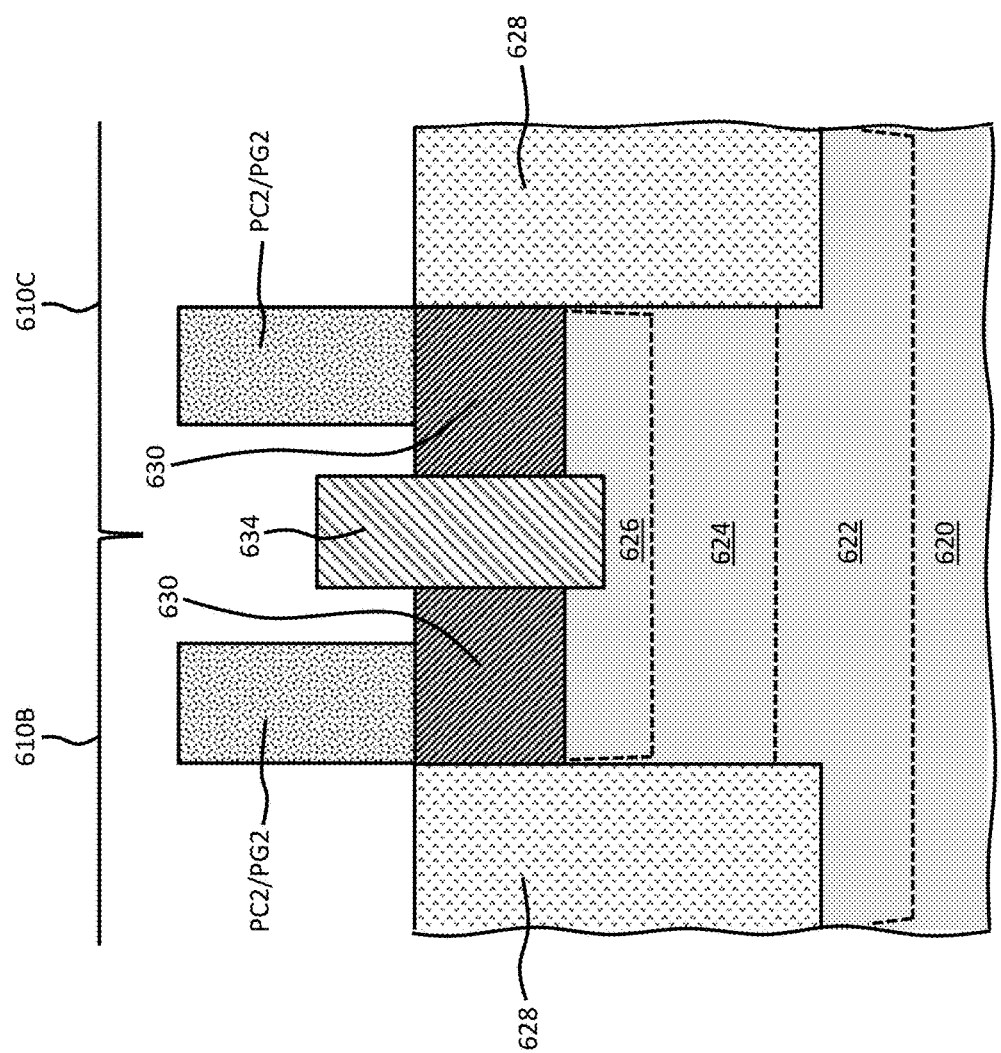
FIG. 30 illustrates a cross-sectional view of another portion of the bitcell array of FIG. 28

FIGS. 28-30 illustrate an array 600 of 6T SRAM bitcells 610A, 610B, 610C and 610D formed on a semiconductor substrate 620 according to the present disclosure. The bitcells 610A, 610B, 610C and 610D of FIGS. 28-30 are substantially similar to the array 100 of 6T SRAM bitcells 110A, 110B, 110C and 110D described above with respect to FIGS. 3-15, the array 200 of 6T SRAM bitcells 210A, 210B, 210C and 210D described above with respect to FIGS. 16 and 17, the array 300 of 6T SRAM bitcells 310A, 310B, 310C and 310D described above with respect to FIGS. 18 and 19, the array 400 of 6T SRAM bitcells 410A, 410B, 410C and 410D of FIGS. 20-23 and the array 500 of 6T SRAM bitcells 510A, 510B, 510C and 510D of FIGS. 24-27, and therefore like reference numerals preceded with "6" are used to indicate like aspects, functions and the like, and the description above directed to aspects, functions and the like thereof (and the alternative embodiments thereof) equally applies to bitcells 610A, 610B, 610C and 610D. As shown in FIGS. 28-30, bitcells 610A, 610B, 610C and 610D differ from bitcells 110A, 110B, 110C and 110D, bitcells 210A, 210B, 210C and 210D, bitcells 310A, 310B, 310C and 310D, bitcells 410A, 410B, 410C and 410D and bitcells 510A, 510B, 510C and 510D in the layout or configuration of the DTIs 628 and CBPs 634.

As shown in FIGS. 28-30, bitcells 610A, 610B, 610C and 610D are configured to dynamically bias the first pass gate transistor PG1 and the second pull-up transistor PU2, and/or the second pass gate transistor PG2 and the first pull-up transistor PU2 via the associated STIs 630 and CBPs 634 through the BOX layer 627. For example, in the illustrated embodiment the STIs 630 of each bitcell 610A, 610B, 610C and 610D are associated with the first and second pass gate transistors PG1, PG2 and the first and second pull-up transistors PU1, PU2. As shown in FIG. 28, an STI 630 extends laterally between the inner edges of the third PC constructs PC3, PC3 of laterally adjacent bitcells (forming the first pass gate transistors PG1, PG1) along the width direction of each bitcell 610A, 610B, 610C and 610D on the outer longitudinal side of the first active region Rx1 along the length direction, and an STI 630 extends laterally between the inner edges of the second PC constructs PC2, PC2 of laterally adjacent bitcells (forming the second pass gate transistors PG2, PG2) along the width direction of each bitcell 610A, 610B, 610C and 610D on the outer longitudinal side of the second active region Rx2 along the length direction. As also shown in FIG. 28, each bitcell 610A, 610B, 610C and 610D further includes an STI 630 extending laterally along the width direction from the outer edges of the third PC constructs PC3, PC3 and the fourth PC constructs PC4, PC4 of laterally adjacent bitcells (forming the first pass gate transistors PG1, PG1 and the second pull-up transistors PU2, PU2, respectively) and longitudinally between the first and fourth active regions Rx1, Rx4 along the length direction. Still further, as shown in FIG. 28 each bitcell 610A, 610B, 610C and 610D further includes an STI 630 extending laterally along the width direction from the outer edges of the second PC constructs PC2, PC2 and the first PC constructs PC1, PC1 of laterally adjacent bitcells (forming the second pass gate transistors PG2, PG2 and the first pull-up transistors PU1, PU1, respectively) and longitudinally between the second and third active regions Rx1, Rx3 along the length direction.

In this way, each bitcell 610A, 610B, 610C and 610D includes four STI 630 regions that include a first STI 630 region associated with the first pass gate transistor PG1, a second STI 630 region associated with the second pass gate transistor PG2, a third STI 630 region associated with the first pass gate transistor PG1 and the second pull-up transistor PU2, and a fourth STI 630 region associated with the second pass gate transistor PG2 and the first pull-up transistor PU1. The first pass gate transistor PG1 and the second pull-up transistor PU2 of each bitcell 610A, 610B, 610C and 610D may share the third STI 630 region thereof, which may be associated and/or abut the first and fourth active regions Rx1, Rx3, as shown in FIG. 28.

As also shown in FIG. 28, the second pass gate transistor PG2 and the first pull-up transistor PU1 of each bitcell 610A, 610B, 610C and 610D may share the fourth STI 630 region thereof, which may be associated and/or abut the second and third active regions Rx2, Rx3. Further, as shown in FIG. 28, two of the STIs 630 may extend across the junction of the second side 614 of a first bitcell and the first side 612 of an adjacent second bitcell along the width direction of the bitcells 610A, 610B, 610C and 610D, and the other two STIs 630 may extend across the junction of the second side 614 of the second bitcell and the first side 612 of an adjacent third bitcell along the width direction of the bitcells 610A, 610B, 610C and 610D. In this way, laterally adjacent bitcells 610A, 610B, 610C and 610D may share a pair of STIs 630 (e.g., extending from common PC constructs and active region(s)). As noted above, each STI 630 may be formed over an associated BP region 626 of the same shape, layout, location, etc.

As shown in FIG. 28, the bitcells 610A, 610B, 610C and 610D each include STI 630 regions extending from the outer edge of first or second active regions Rx1, Rx2 along the length direction away from the interior of the respective bitcell 610A, 610B, 610C and 610D. For example, STIs 630 may extend from the outer edge of the first or second active regions Rx1, Rx2 along the length direction away from the other of the first or second active regions Rx1, Rx2. In some other embodiments, these STIs 630 may be spaced from an active region. Each bitcell 610A, 610B, 610C and 610D may thereby include a first STI 630 extending from the outer edge of the first active region Rx1 along the length direction away from the interior of the respective bitcell 610A, 610B, 610C and 610D (e.g., away from the second active region Rx2 along the length direction), and a second STI 630 extending from the outer edge of the second active region Rx2 along the length direction away from the interior of the respective bitcell 610A, 610B, 610C and 610D (e.g., away from the first active region Rx2 along the length direction), as shown in FIG. 28. As also shown in FIG. 28, such STIs 630 may extend from the outer edge of first or second active regions Rx1, Rx2 along the length direction away from the interior of the respective bitcell 610A, 610B, 610C and 610D and to a medial portion of the respective third PC construct PC3 (forming the first pass gate transistor PG1) or second PC construct PC2 (forming the second pass gate transistor PG2) along the length direction. In this way, such STI 630 regions may be fully positioned between the respective third PC constructs PC3 or second PC constructs PC2, PC2 of laterally adjacent bitcells 610A, 610B, 610C and 610D along the length and width directions.

As shown in FIG. 28, the STIs 630 proximate to the outer longitudinal sides of the first or second active region Rx1, Rx2 along the length direction may extend along the width direction between the respective third PC constructs PC2, PC3 or the second PC constructs PC2, PC2 of laterally adjacent bitcells 610A, 610B, 610C and 610D. In this way, the STIs 630 proximate to the outer longitudinal sides of the first or second active region Rx1, Rx2 along the length direction may extend across the junctions of the first lateral side 612 and the second lateral side 614 of laterally adjacent bitcells 610A, 610B, 610C and 610D.

As shown in FIG. 28, in addition to the STI 630 regions positioned at or past the outer longitudinal ends of the first or second active region Rx1, Rx2 along the length direction of each bitcell 610A, 610B, 610C and 610D, the bitcells may include additional STI 630 regions extending laterally along the width direction from the inner side edges of the first PC constructs PC1, PC1 and the second PC constructs PC2, PC2 or the from the inner side edges of the third PC constructs PC3, PC3 and the fourth PC constructs PC4, PC4, and longitudinally along the length direction between the first and fourth active regions Rx1, Rx4 or between the second and third active regions Rx2, Rx3, respectively, as shown in FIG. 28. In some embodiments, the portions of the STI 630 regions that are positioned between the first and fourth active regions Rx1, Rx4 and between the second and third active regions Rx2, Rx3 along the length direction of the bitcells 610A, 610B, 610C and 610D that are proximate or abutting to the respective active region (i.e., a portion proximate to the first, second, third or fourth active region Rx1, Rx2, Rx3 Rx4) may extend between (and abut) the inner lateral sides or edges of the respective third PC constructs PC3, PC3, fourth PC constructs PC4, PC4, first PC constructs PC1, PC1 or second PC constructs PC2, PC2 of laterally adjacent bitcells 610A, 610B, 610C and 610D. The medial portions of the STI 630 regions that are positioned between the third and fourth active regions Rx3, Rx4 or between the first and second PC constructs PC1, PC2 along the length direction of the bitcells 610A, 610B, 610C and 610D may extend between the outer lateral side edges of the third and fourth active regions Rx3, Rx4 or between the first and second PC constructs PC1, PC2 along the width direction of laterally adjacent bitcells 610A, 610B, 610C and 610D. As noted above, each STI 630 may be formed over an associated BP region 626 of the same shape, layout, location, etc.

Each bitcell 610A, 610B, 610C and 610D may include a CBP 634 associated with the STI 630 regions that are positioned at or past the outer longitudinal ends of the first or second active regions Rx1, Rx2 along the length direction, as shown in FIGS. 28-30. These STI 630 regions may abut and extend about a respective CBP 634 (e.g., along the length and/or width directions). As shown in FIG. 28, each CBP 634 may positioned in a medial portion of the respective STI 630 along the width direction and may be offset toward the outer longitudinal edge of the respective STI 630 along the length direction. In this way, as shown in FIG. 28 each CBP 634 may be fully positioned within a respective STI 630, and spaced further from the inner edge or side of the respective STI 630 that abuts or extends from the respective first or second active region Rx1, Rx2 than the outer longitudinal edge along the length direction (that abuts or extends from a DTI 628, as shown in FIG. 29). Along the width direction, each CBP 634 may be spaced between the respective third PC constructs PC3, PC3 or second PC constructs PC2, PC2 (e.g., potentially evenly spaced) of laterally adjacent bitcell 610A, 610B, 610C and 610D, as shown in FIGS. 28 and 30. Each CBP 634 may thereby be centered on the junctions of the first and second lateral sides 612, 614 along the width direction of laterally adjacent bitcell 610A, 610B, 610C and 610D, as shown in FIGS. 28 and 30.

As shown in FIGS. 28 and 30, the CBPs 634 of each bitcell 610A, 610B, 610C and 610D may be spaced and isolated from the respective third PC construct PC3, second PC construct PC2, first and second PC constructs PC1, PC1, or third and fourth PC constructs PC3, PC4 along the width direction by a respective STI 630. Similarly, as shown in FIGS. 28 and 29, the CBPs 634 of each bitcell 610A, 610B, 610C and 610D may be spaced and isolated from the respective first active region Rx1, second active region Rx2, first and fourth active regions Rx1, Rx4 or second and third active regions Rx2, Rx3 along the length direction by a respective STI 630. While an STI 630 may physically space a respective CBP 634 from the one or more associated active region along the length direction and the one or more associated PC construct along the width direction, the respective CBP 634 may be in contact with the associated BP region 626 which extends below the STIs 630 (and the CBPs 634) and to the associated first active region Rx1 forming the first pass gate transistor PG1 (with the third PC construct PC3) and the fourth active region Rx4 forming the second pull-up transistor PU2 (with the fourth PC construct PC4) or to the associated second active region Rx2 forming the second pass gate transistor PG2 (with the second PC construct PC2) and the third active region Rx3 forming the first pull-up transistor PU1 (with the first PC construct PC1) of each bitcell 610A, 610B, 610C and 610D, as shown in FIG. 29. As shown in FIG. 29, a STI 630 may extend longitudinally between the respective first and fourth active regions Rx1, Rx4 or the second and third active regions Rx2, Rx3 along the length direction as opposed to a DTI 628. Similarly, an STI 630 may extend laterally between the respective third active regions Rx3, Rx3, third and fourth active regions Rx3, Rx3, Rx4, Rx4, second active regions Rx2, Rx2, or second and first active regions Rx2, Rx2, Rx1, Rx1 of laterally adjacent bitcells 610A, 610B, 610C and 610D as opposed to a DTI 628.

As shown in FIGS. 29 and 30, the bitcells 610A, 610B, 610C and 610D however include the BP regions 626 below the STIs 630 and the CBPs 634 thereof. Each bitcell 610A, 610B, 610C and 610D thereby includes the BP regions 626 below the first, second, third and fourth active regions Rx1, Rx2, Rx3 and Rx4 and the STIs 630 and the CBPs 634. In this way, the size, shape, layout, location, etc. of the BP regions 626 may be formed to correspond to that of the first, second, third and fourth active regions Rx1, Rx2, Rx3 and Rx4 and the STIs 630 and the CBPs 634. As shown in FIG. 29, a BP region 626 may thereby extend beneath the CBP 634 and STI 630 proximate to the outer longitudinal side along the length direction of the second active region Rx2, the second active region Rx2, the STI 630 extending longitudinally between the second and fourth active regions Rx2, Rx4 along the length direction, and the fourth active region Rx4 of each bitcell 610A, 610B, 610C and 610D. Similarly, a BP region 626 may extend beneath the CBP 634 and STI 630 proximate to the outer longitudinal side along the length direction of the first active region Rx1, the first active region Rx1, the STI 630 extending longitudinally between the first and fourth active regions Rx1, Rx3 along the length direction, and the third active region Rx3 of each bitcell 610A, 610B, 610C and 610D. One CBP 634 of each bitcell 610A, 610B, 610C and 610D may thereby provide contact to the BP region 626 associated with the first pass gate transistor PG1 and the second pull-up transistor PU2 (formed by the first and fourth active regions Rx1, Rx4 and the third and fourth PC constructs PC3, PC4), and another CBP 634 of each bitcell 610A, 610B, 610C and 610D may thereby provide contact to the BP region 626 associated with the second pass gate transistor PG2 and the first pull-up transistor PU1 (formed by the second and third active regions Rx2, Rx3 and the first and second PC constructs PC1, PC2).

In this way, during a read operation of one or more of the bitcells 610A, 610B, 610C and 610D, a grounding voltage or a lower voltage can be dynamically applied to at least one of the CBPs 634 thereof, and thereby the associated at least one BP region 626, to dynamically negatively bias at least one of the first pass gate and second pull-up PG1, PU2 transistors and the second pass gate and first pull-up PG2, PU1 transistors through the BOX layer 627. The electrical potential applied to at least one of the CBPs 634 may thereby pass or be transferred to at least one of the first pass gate and second pull-up PG1, PU2 transistors and the second pass gate and first pull-up PG2, PU1 transistors through the associated at least one BP region 626 and BOX layer 627 to effect operation of at least one of the first pass gate and second pull-up PG1, PU2 transistors and the second pass gate and first pull-up PG2, PU1 transistors. Stated differently, the potential of at least one of the CBPs 634 can bias or effect at least one of the first pass gate and second pull-up PG1, PU2 transistors and the second pass gate and first pull-up PG2, PU1 transistors through or via the associated at least one BP region 626 and BOX layer 627 to effect operation of at least one of the first pass gate and second pull-up PG1, PU2 transistors and the second pass gate and first pull-up PG2, PU1 transistors.

In some embodiments, only one of the CBPs 634 and an associated BP region 626 may be utilized to bias one of the first pass gate and second pull-up PG1, PU2 transistors or the second pass gate and first pull-up PG2, PU1 transistors of a bitcell. In other embodiments, both of the CBPs 634 (and thereby the associated BP regions 626) may be utilized to bias both the first pass gate and second pull-up PG1, PU2 transistors and the second pass gate and first pull-up PG2, PU1 transistors of a bitcell. The negative bias to the first pass gate and second pull-up PG1, PU2 transistors and/or the second pass gate and first pull-up PG2, PU1 transistors may form a weaker nFET to, thereby, improve the readability, SNM and beta cell ratio of the bitcell(s). Similarly, standby mode of one or more of the bitcells 610A, 610B, 610C and 610D, a grounding voltage or a lower voltage can be dynamically applied to at least one of the CBPs 634 thereof, and thereby the associated at least one BP region 626, to dynamically negatively bias the first pass gate and second pull-up PG1, PU2 transistors and/or the second pass gate and first pull-up PG2, PU1 transistors through the BOX layer 627 to improve data retention. Conversely, during a write operation of one or more of the bitcells 610A, 610B, 610C and 610D, a positive voltage can be dynamically applied to at least one CBP 634, and thereby at least one associated BP region 626, to dynamically positively bias the first pass gate and second pull-up PG1, PU2 transistors and/or the second pass gate and first pull-up PG2, PU1 transistors through the BOX layer 627. The positive bias to at least one of the first pass gate and second pull-up PG1, PU2 transistors and the second pass gate and first pull-up PG2, PU1 transistors may form a stronger nFET to, thereby, improve the writeability, SNM, gamma ratio and/or write margin of the bitcell(s). The negative bias, positive bias (or lack of bias) applied to at least one of the first pass gate and second pull-up PG1, PU2 transistors and the second pass gate and first pull-up PG2, PU1 transistors of at least one of the bitcells 610A, 610B, 610C and 610D via the corresponding at least one CBP 634 and BP region 626 may thereby improve the Vmin and yield of the bitcells 610A, 610B, 610C and 610D.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

As used herein, the terms "comprising" and "including" or grammatical variants thereof are to be taken as specifying the stated features, integers, steps or components but do not preclude the addition of one or more additional features, integers, steps, components or groups thereof. This term encompasses the terms "consisting of" and "consisting essentially of".

The phrase "consisting essentially of" or grammatical variants thereof when used herein are to be taken as specifying the stated features, integers, steps or components but do not preclude the addition of one or more additional features, integers, steps, components or groups thereof but only if the additional features, integers, steps, components or groups thereof do not materially alter the basic and novel characteristics of the claimed composition, device or method.

While several aspects and embodiments of the present disclosure have been described and depicted herein, alternative aspects and embodiments may be affected by those skilled in the art to accomplish the same objectives. Accordingly, this disclosure and the appended claims are intended to cover all such further and alternative aspects and embodiments as fall within the true spirit and scope of the present disclosure.

The invention claimed is:

1. Static random access memory (SRAM) bitcell structures, the structures comprising:
a semiconductor substrate including a silicon substrate, a deep n-well (DNW) layer formed over the silicon substrate, p-well (PW) regions formed over portions of the DNW layer, and doped back-plate (BP) regions formed over portions of the PW regions;
a buried oxide (BOX) layer formed over the PW regions and the BP regions of the semiconductor substrate;
first, second, third and fourth active regions formed on the BOX layer and over portions of the BP regions;
a first polysilicon gate conductor (PC) construct overlapping a portion of the first active region transistor and a portion of the third active region forming channels of a first pull-down (PD1) transistor and a first pull-up (PU1) transistor respectively, a second PC construct overlapping a portion of the second active region forming a channel of a second pass gate (PG2) transistor, a third PC construct overlapping a portion of the first active region forming a channel of a first pass gate (PG1) transistor, and a fourth PC construct overlapping a portion of the third active region and the fourth active region forming channels of a second pull-down (PD2) transistor and a second pull-up (PU2) transistor respectively;
at least one shallow trench isolation (STI) region extending at least one of from the first active region and below the first PC construct or from the second active region and below the fourth PC construct; and
at least one contact to back gate (CBP),
wherein a BP region extends directly beneath the at least one CBP, the at least one STI region and the BOX layer below the channel of at least one of the PD1 transistor and the PD2 transistor to facilitate biasing of at least one the PD1 transistor and the PD2 transistor, respectively, via the at least one CBP during at least one of a read, write or standby operation of the bitcell structures.

2. The SRAM bitcell structures of claim 1, comprising a first STI region extending from the first active region and below the first PC construct, and a second STI region extending from the second active region and below the fourth PC construct.

3. The SRAM bitcell structures of claim 2, comprising a first CBP and a first BP region that extends directly beneath the first CBP, the first STI region and the BOX layer below the channel of the PD1 transistor, and a second CBP and a second BP region that extends directly beneath the second CBP, the second STI region and the BOX layer below the channel of the PD2 transistor.

4. The SRAM bitcell structures of claim 3, wherein the first STI region extends about a first portion of the first CBP and a first deep trench isolation (DPI) region extends about a second portion of the first CBP, and the second STI region extends about a first portion of the second CBP and a second DPI region extends about a second portion of the second CBP.

5. The SRAM bitcell structures of claim 4, wherein the first DPI region extends into the bitcells structures past the first BP region, through at least one PW region, and at least partially through the DNW layer, and wherein the second DPI region extends into the bitcells structures past the second BP region, through at least one PW region, and at least partially through the DNW layer.

6. The SRAM bitcell structures of claim 3, wherein the first STI region extends below the first and third PC constructs and therebetween, and the second STI region extends below the fourth and second PC constructs and therebetween.

7. The SRAM bitcell structures of claim 6, wherein the first BP region further extends directly beneath the BOX layer below the channel of the PG1 transistor to facilitate biasing of the PD1 transistor and the PG1 transistor via the first CBP during at least one of a read, write or standby operation of the bitcell structures, and wherein the second BP region further extends directly beneath the BOX layer below the channel of the PG2 transistor to facilitate biasing of the PD2 transistor and the PG2 transistor via the second CBP during at least one of a read, write or standby operation of the bitcell structures.

8. The SRAM bitcell structures of claim 6, wherein the first STI region extends about a first portion of the first CBP and a first deep trench isolation (DPI) region extends about a second portion of the first CBP, and the second STI region extends about a first portion of the second CBP and a second DPI region extends about a second portion of the second CBP.

9. The SRAM bitcell structures of claim 8, wherein the first DPI region extends into the bitcells structures past the first BP region, through at least one PW region, and at least partially through the DNW layer, and wherein the second DPI region extends into the bitcells structures past the second BP region, through at least one PW region, and at least partially through the DNW layer.

10. The SRAM bitcell structures of claim 3, further comprising a third STI region extending from an opposing side of the first active region as the first STI region to the third active region, and a fourth STI region extending from an opposing side of the second active region as the second STI region and to the fourth active region.

11. The SRAM bitcell structures of claim 10, wherein the third STI region extends below the first PC construct, and the fourth STI region extends below the fourth PC construct.

12. The SRAM bitcell structures of claim 11, wherein the first BP region further extends directly beneath the third STI region and the BOX layer below the channel of the PU1 transistor to facilitate biasing of the PD1 transistor, the PG2 transistor and the PU1 transistor via the first CBP during at least one of a read, write or standby operation of the bitcell structures, and wherein the second BP region further extends directly beneath the fourth STI region and the BOX layer below the channel of the PU2 transistor to facilitate biasing of the PD2 transistor, the PG1 transistor and the PU1 transistor via the second CBP during at least one of a read, write or standby operation of the bitcell structures.

13. The SRAM bitcell structures of claim 12, wherein the first STI region extends about a first portion of the first CBP and a first deep trench isolation (DPI) region extends about a second portion of the first CBP, and the second STI region extends about a first portion of the second CBP and a second DPI region extends about a second portion of the second CBP.

14. The SRAM bitcell structures of claim 13, wherein the first DPI region extends into the bitcells structures past the first BP region, through at least one PW region, and at least partially through the DNW layer, and wherein the second DPI region extends into the bitcells structures past the second BP region, through at least one PW region, and at least partially through the DNW layer.

15. A method of selectively biasing at least one of a PD1 transistor and a PD2 transistor of a SRAM bitcell structure, comprising at least one of:
  selectively applying a grounding voltage or a lower voltage to the at least one CBP of at least one of the SRAM bitcell structures of claim 1 during a read operation of the at least one bitcell structure; and
  selectively applying a positive voltage to the at least one CBP of at least one of the SRAM bitcell structures of claim 1 during a write operation of the at least one bitcell structure.

16. A method of forming static random access memory (SRAM) bitcell structures, the method comprising:
  obtaining a semiconductor substrate comprising:
    a silicon substrate;
    a deep n-well (DNW) layer formed over the silicon substrate;
    p-well (PW) regions formed over portions of the DNW layer;
    doped back-plate (BP) regions formed over portions of the PW regions;
    a buried oxide (BOX) layer formed over the PW regions and the BP regions of the semiconductor substrate; and
    an active layer formed on the BOX layer and over portions of the BP regions;
  forming at least one deep trench extending through at least a first portion of the active layer and at least to the DNW layer;
  forming at least one shallow trench extending through at least a second portion of the active layer and at least to a BP region such that at least one active region extending between the at least one deep trench and the at least one shallow trench is formed from the active layer and at a BP region extends beneath the at least one shallow trench and the at least one active region; and
  forming at least one polysilicon gate conductor (PC) construct overlapping the at least one active region to form a channel of at least one of a first pull-down (PD1) transistor and a second pull-down (PUD) transistor.

17. The method of claim 16, further comprising:
  filling the at least one deep trench with an oxide material to form at least one deep trench isolation region (DTI);
  filling a first portion of the at least one shallow trench with an oxide material to form at least one shallow isolation region (STI); and
  filling a second portion of the at least one shallow trench with a conductive material to form at least one contact to back plate (CBP) region to facilitate biasing at least one of the PD1 transistor and the PD2 transistor via the at least one CBP during at least one of a read, write or standby operation of the bitcell structures.

18. The method of claim 16, wherein the at least one shallow trench is formed prior to formation of the at least one deep trench.

19. The method of claim 16, wherein the at least one deep trench is formed prior to formation of the at least one shallow trench.

* * * * *